United States Patent
Lin et al.

(10) Patent No.: US 12,490,483 B2
(45) Date of Patent: Dec. 2, 2025

(54) SEMICONDUCTOR DEVICES AND METHODS OF MANUFACTURING THEREOF

(71) Applicant: Taiwan Semiconductor Manufacturing Company, Ltd., Hsinchu (TW)

(72) Inventors: Shih-Yao Lin, New Taipei (TW); Hsiao Wen Lee, Hsinchu (TW); Chao-Cheng Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/741,356

(22) Filed: Jun. 12, 2024

(65) Prior Publication Data

US 2024/0332360 A1   Oct. 3, 2024

Related U.S. Application Data

(63) Continuation of application No. 17/460,204, filed on Aug. 28, 2021, now Pat. No. 12,040,359.

(51) Int. Cl.
| | |
|---|---|
| *H01L 29/08* | (2006.01) |
| *H01L 29/06* | (2006.01) |
| *H01L 29/423* | (2006.01) |
| *H01L 29/66* | (2006.01) |
| *H01L 29/786* | (2006.01) |
| *H10D 30/01* | (2025.01) |
| *H10D 30/67* | (2025.01) |
| *H10D 62/10* | (2025.01) |

(Continued)

(52) U.S. Cl.
CPC ......... *H10D 62/151* (2025.01); *H10D 30/031* (2025.01); *H10D 30/6735* (2025.01); *H10D 30/6757* (2025.01); *H10D 62/116* (2025.01); *H10D 64/017* (2025.01); *H10D 64/018* (2025.01)

(58) Field of Classification Search
CPC ............... H10D 62/151; H10D 30/031; H10D 30/6735; H10D 30/6757; H10D 62/116; H10D 64/017; H10D 64/018; B82Y 10/00; H01L 29/0673; H01L 29/42392; H01L 29/66439; H01L 29/6653; H01L 29/775; H01L 29/78696; H01L 29/66545
USPC ....................................................... 257/401
See application file for complete search history.

(56) References Cited

U.S. PATENT DOCUMENTS

| | | | |
|---|---|---|---|
| 12,040,359 B2 * | 7/2024 | Lin ...................... | H01L 29/6653 |
| 2017/0117375 A1 * | 4/2017 | Kim ................... | H01L 29/42392 |
| 2018/0294331 A1 * | 10/2018 | Cho .................. | H01L 29/78696 |

(Continued)

OTHER PUBLICATIONS

Non-Final Office Action on U.S. Appl. No. 17/460,204 DTD Jan. 17, 2024.

(Continued)

*Primary Examiner* — Tong-Ho Kim
(74) *Attorney, Agent, or Firm* — FOLEY & LARDNER LLP

(57) ABSTRACT

A semiconductor device includes a plurality of channel layers vertically spaced from one another, a gate structure wrapping around each of the plurality of channel layers; and an inner spacer that is disposed along sidewalls of a lower portion of the gate structure. The inner spacer curves toward the lower portion of the gate structure.

20 Claims, 23 Drawing Sheets

(51) Int. Cl.
*H10D 62/13* (2025.01)
*H10D 64/01* (2025.01)

(56) References Cited

U.S. PATENT DOCUMENTS

| | | | |
|---|---|---|---|
| 2019/0006485 | A1 | 1/2019 | Kim et al. |
| 2019/0237559 | A1* | 8/2019 | Cheng .................. B82Y 10/00 |
| 2020/0105761 | A1 | 4/2020 | Liaw |
| 2020/0185539 | A1 | 6/2020 | Lee et al. |
| 2020/0328208 | A1 | 10/2020 | Chiang et al. |
| 2020/0365692 | A1* | 11/2020 | Jung ..................... H10D 30/62 |

OTHER PUBLICATIONS

Non-Final Office Action on U.S. Appl. No. 17/672,404 DTD May 21, 2024.
Notice of Allowance on U.S. Appl. No. 17/460,204 DTD Apr. 25, 2024.

* cited by examiner

SEMICONDUCTOR DEVICES AND METHODS OF MANUFACTURING THEREOF

CROSS REFERENCE TO RELATED APPLICATIONS

This application is a continuation of U.S. patent application Ser. No. 17/460,204, filed on Aug. 28, 2021, the entire disclosure of which is incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
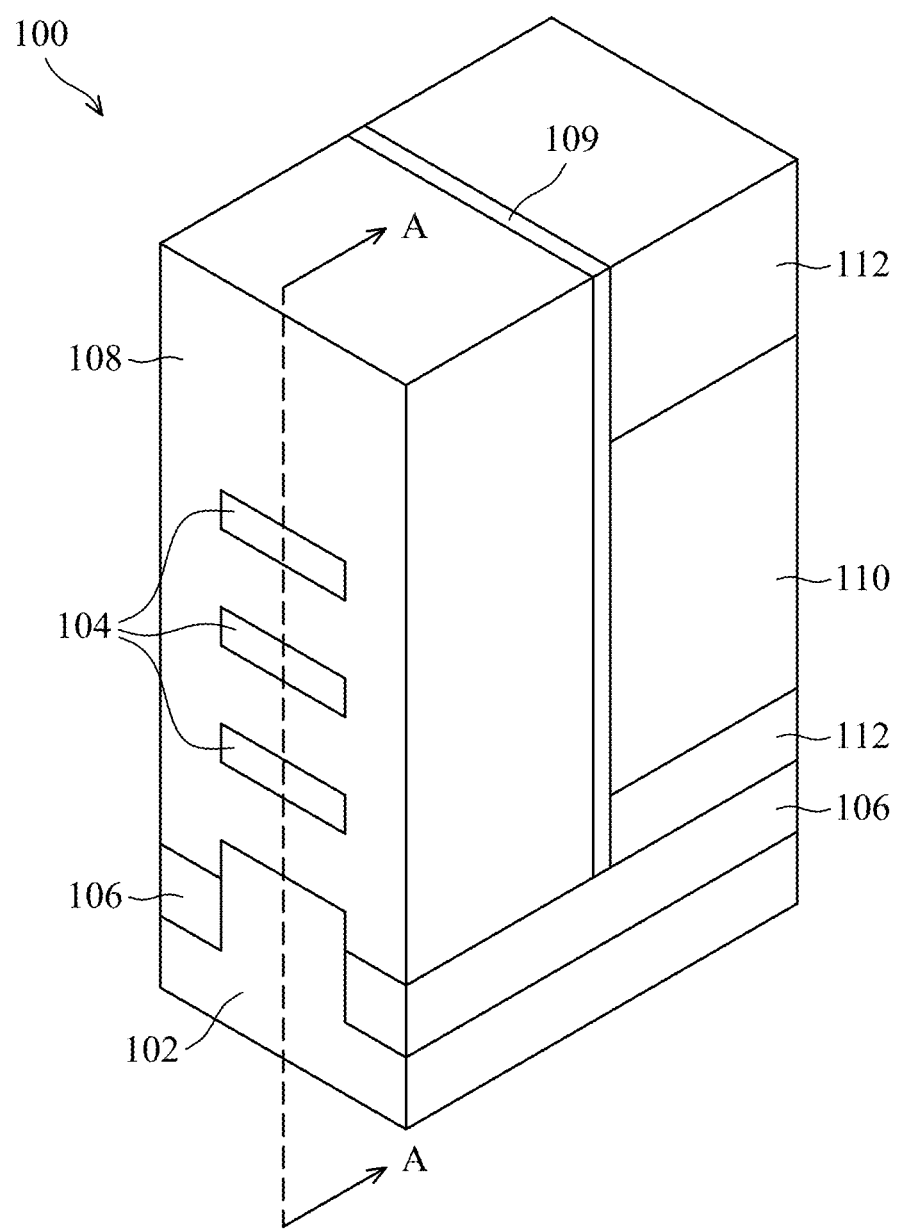
FIG. 1 illustrates a perspective view of a gate-all-around (GAA) field-effect-transistor (FET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In contemporary semiconductor device fabrication processes, a large number of semiconductor devices, such as silicon channel n-type field effect transistors (nFETs) and silicon germanium channel p-type field effect transistors (pFETs), are fabricated on a single wafer. Non-planar transistor device architectures, such as fin-based transistors, can provide increased device density and increased performance over planar transistors. Some advanced non-planar transistor device architectures, such as nanostructure transistors, can further increase the performance over fin-based transistors. Example nanostructure transistors include nanosheet transistors, nanowire transistors, and the like. The nanostructure transistor includes one or more nanostructures, collectively configured as a conduction channel of the transistor, that are fully wrapped by a gate structure. When compared to the fin-based transistors where the channel is partially wrapped by a gate structure, the nanostructure transistor, in general, can include one or more gate stacks that wrap around the full perimeter of a nanostructure channel. In some embodiments, the gate stack partially wrap around the nanostructure channel. As such, control over the nanostructure channel may be further improved, thus causing, for example, a relatively large driving current given the similar size of the fin-based transistor and nanostructure transistor.

However, in existing nanostructure transistor configuration, a source/drain structure is typically coupled to a number of channel layers through their respective single sidewalls. As such, the number of contact faces between the channel layers and the source/drain structure may be limited. Accordingly, a contact area between the channel layers and the source/drain structure is limited, which may adversely impact a potential to improve performance of the nanostructure transistor. Embodiments of the present disclosure are discussed in the context of forming a gate-all-around (GAA) field-effect-transistor (FET) device, and in particular, in the context of forming an increased contact area between a source/drain structure and channel layers. For example, in addition to contacting the source/drain structure through the sidewall of each of the channel layers, a top surface and a bottom surface of each channel layer can partially contact the source/drain structure. In this way, the contact area between the source/drain structure and the channel layers can be significantly increased, which can further improve the performance of a nanostructure transistor.

FIG. 1 illustrates a perspective view of an example GAA FET device 100, in accordance with various embodiments. The GAA FET device 100 includes a substrate 102 and a number of semiconductor layers (e.g., nanosheets, nanowires, or otherwise nanostructures) 104 above the substrate 102. The semiconductor layers 104 are vertically separated from one another, which can collectively function as a (conduction) channel of the GAA FET device 100. Isolation regions 106 are formed on opposing sides of a protruded portion of the substrate 102, with the semiconductor layers 104 disposed above the protruded portion. A gate structure 108 wraps around each of the semiconductor layers 104 (e.g., a full perimeter of each of the semiconductor layers 104). A spacer 109 extends along each sidewall of the gate structure 108. Source/drain structures are disposed on opposing sides of the gate structure 108 with the spacer 109 disposed therebetween, e.g., source/drain structure 110 shown in FIG. 1. An interlayer dielectric (ILD) 112 is disposed over the source/drain structure 110.

The GAA FET device shown in FIG. 1 is simplified, and thus, it should be understood that one or more features of a completed GAA FET device may not be shown in FIG. 1. For example, the other source/drain structure opposite the gate structure 108 from the source/drain structure 110 and the ILD disposed over such a source/drain structure are not shown in FIG. 1. Further, FIG. 1 is provided as a reference to illustrate a number of cross-sections in subsequent figures. As indicated, cross-section A-A is cut along a longitudinal axis of the semiconductor (channel) layers 104 and in a direction of a current flow between the source/drain structures. Subsequent figures refer to the reference cross-section for clarity.

Figure 2:
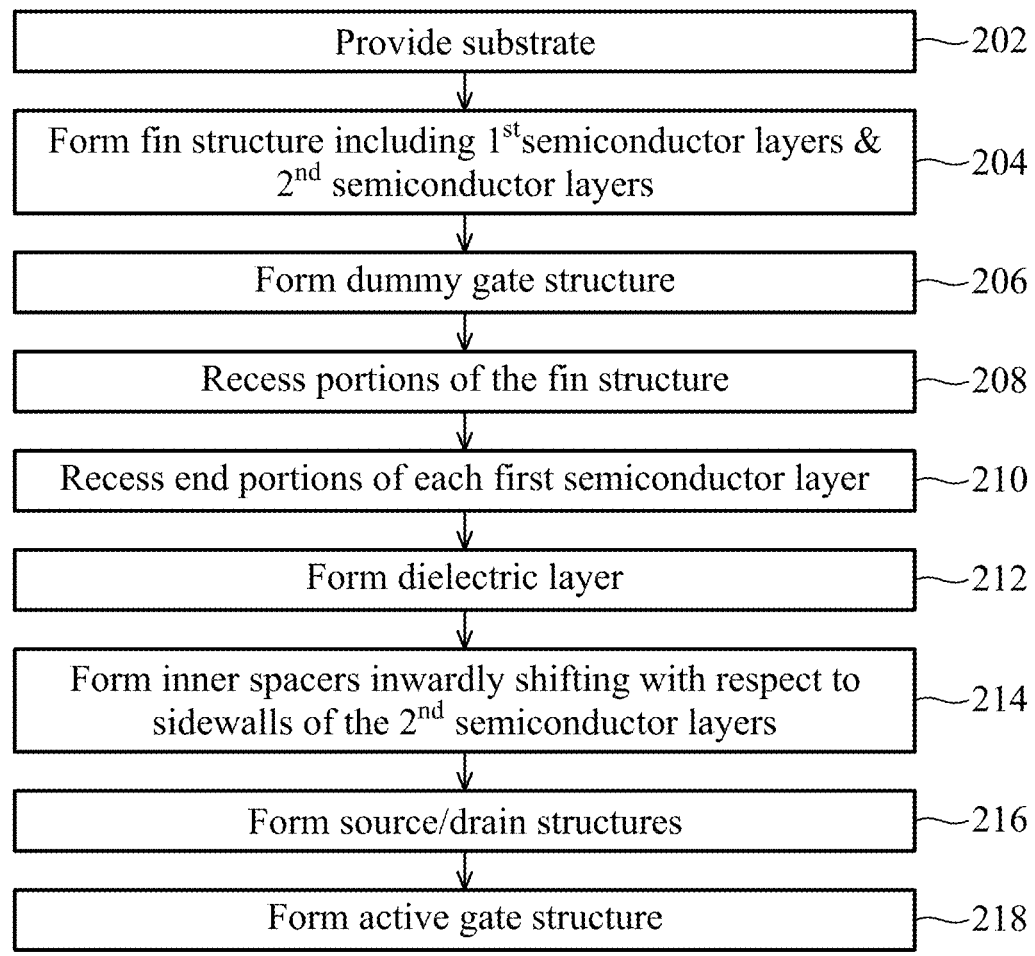
FIG. 2 illustrates a flow chart of an example method for making a non-planar transistor device, in accordance with some embodiments.

FIG. 2 illustrates a flowchart of a method 200 to form a non-planar transistor device, according to one or more embodiments of the present disclosure. For example, at least some of the operations (or steps) of the method 200 can be used to form a FinFET device, a GAA FET device (e.g., GAA FET device 100), a nanosheet transistor device, a nanowire transistor device, a vertical transistor device, a gate-all-around (GAA) transistor device, or the like. It is noted that the method 200 is merely an example, and is not intended to limit the present disclosure. Accordingly, it is understood that additional operations may be provided before, during, and after the method 200 of FIG. 2, and that some other operations may only be briefly described herein. In some embodiments, operations of the method 200 may be associated with cross-sectional views of an example GAA FET device at various fabrication stages as shown in FIGS. 3, 4, 5, 6, 7A, 7B, 7C, 7D, 8A, 8B, 8C, 8D, 9A, 9B, 9C, 10A, 10B, 10C, 11A, 11B, and 11C, respectively, which will be discussed in further detail below.

In brief overview, the method 200 starts with operation 202 of providing a substrate. The method 200 continues to operation 204 of forming a fin structure including a number of first semiconductor layers and a number of second semiconductor layers. The method 200 continues to operation 206 of forming a dummy gate structure. Next, the method 200 continues to operation 208 of recessing portions of the fin structure. Next, the method 200 continues to operation 210 of recessing end portions of each of the first semiconductor layers. Next, the method 200 continues to operation 212 of forming a dielectric layer, followed by operation 214 in which a number of inner spacers are formed. The inner spacers inwardly shift with respect to sidewalls of the second semiconductor layers. Next, the method 200 proceeds to operation 216 of forming source/drain structures. Then, the method 200 continues to operation 218 of forming an active gate structure.

As mentioned above, FIGS. 3-11C each illustrate, in a cross-sectional view, a portion of a GAA FET device 300 at various fabrication stages of the method 200 of FIG. 2. The GAA FET device 300 is similar to the GAA FET device 100 shown in FIG. 1, but with certain features/structures/regions not shown, for the purposes of brevity. For example, the following figures of the GAA FET device 300 do not include source/drain structures (e.g., 110 of FIG. 1). It should be understood the GAA FET device 300 may further include a number of other devices (not shown in the following figures) such as inductors, fuses, capacitors, coils, etc., while remaining within the scope of the present disclosure.

Figure 3:
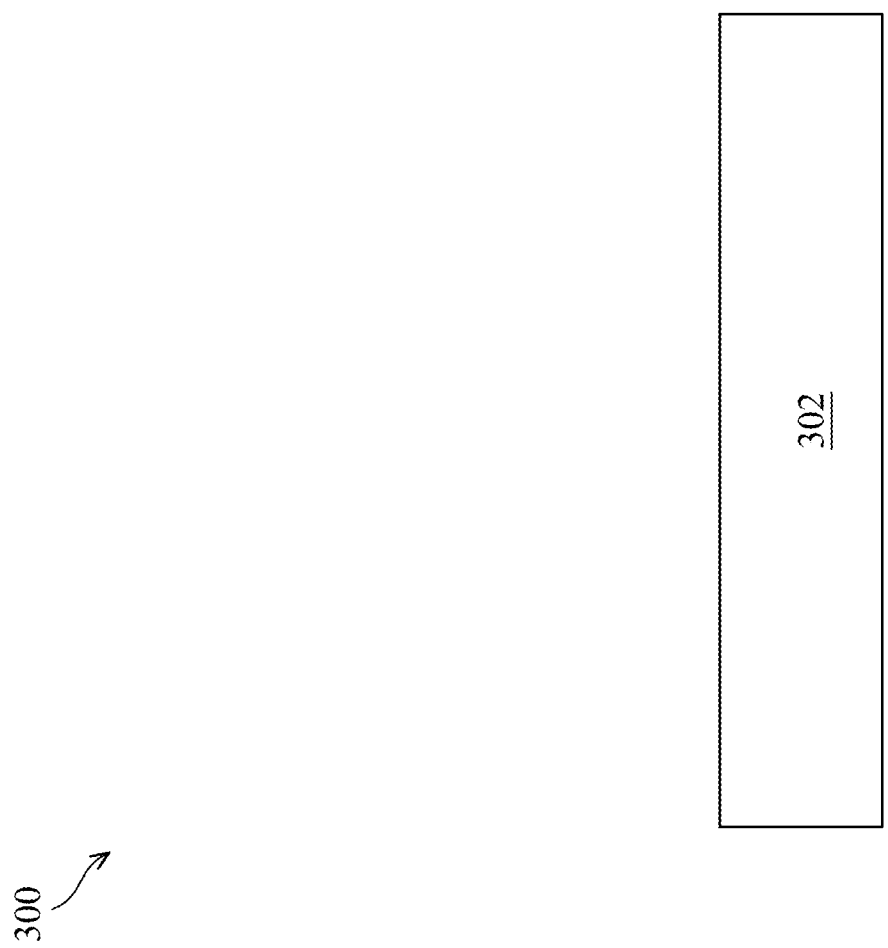
FIGS. 3, 4, 5, 6, 7A, 7B, 7C, 7D, 8A, 8B, 8C, 8D, 9A, 9B, 9C, 10A, 10B, 10C, 11A, 11B, and 11C illustrate cross-sectional views of an example GAA FET device (or a portion of the example GAA FET device) during various fabrication stages, made by the method of FIG. 2, in accordance with some embodiments.

Corresponding to operation 202 of FIG. 2, FIG. 3 is a cross-sectional view of the GAA FET device 300 including a semiconductor substrate 302 at one of the various stages of fabrication. The cross-sectional view of FIG. 3 is cut in a direction along the lengthwise direction of a number of channel layers of the GAA FET device 300 (e.g., cross-section A-A indicated in FIG. 1).

The substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 4:
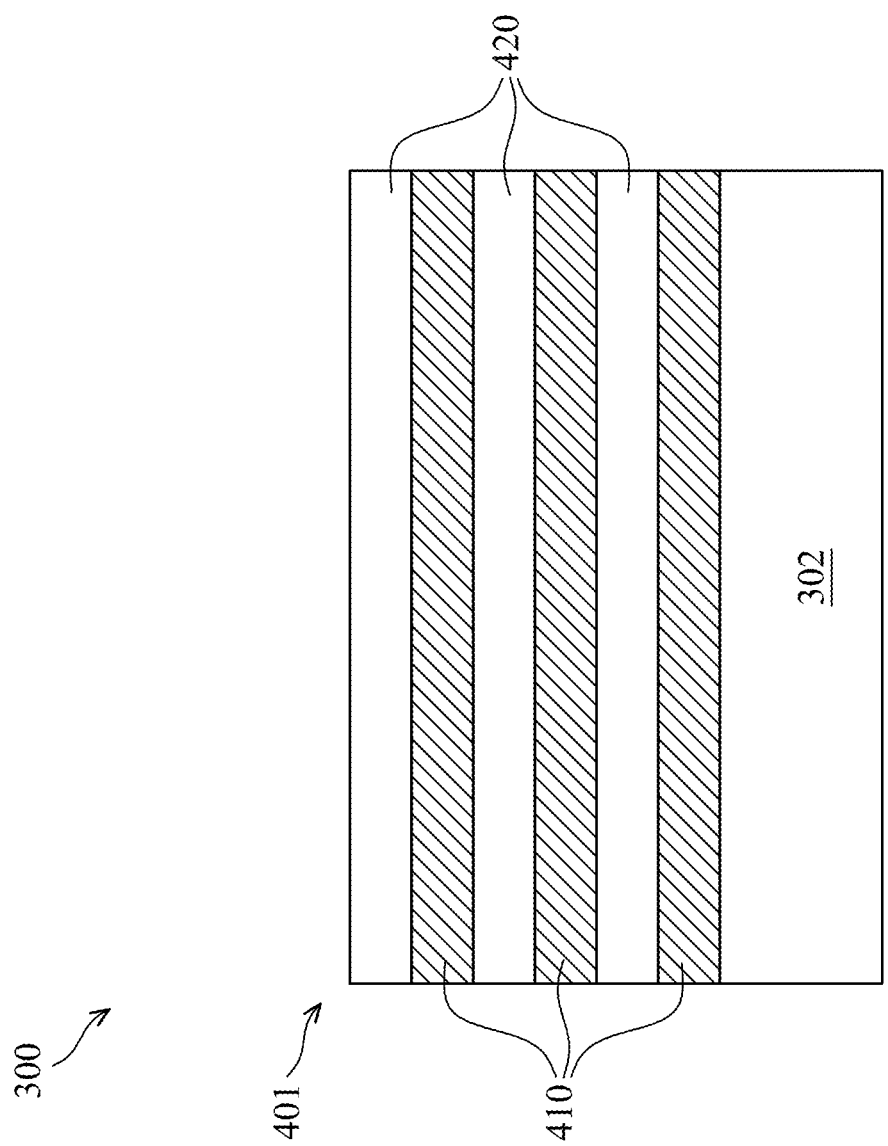

Corresponding to operation 204 of FIG. 2, FIG. 4 is a cross-sectional view of the GAA FET device 300 including fin structure 401 formed over the substrate 302 at one of the various stages of fabrication. The cross-sectional view of FIG. 4 is cut in a direction along the lengthwise direction of a number of channel layers of the GAA FET device 300 (e.g., cross-section A-A indicated in FIG. 1).

To form the fin structure 401, a number of first semiconductor layers 410 and a number of second semiconductor layers 420 are alternatingly disposed (e.g., deposited) on top of one another to first form a stack. For example, one of the second semiconductor layers 420 is disposed over one of the first semiconductor layers 410 then another one of the first semiconductor layers 420 is disposed over the second semiconductor layer 410, so on and so forth. The first and second stacks may include any number of alternately disposed first and second semiconductor layers 410 and 420, respectively. For example in FIG. 4, the stack includes 3 first semiconductor layers 410, with 3 second semiconductor layers 420 alternatingly disposed therebetween and with one of the second semiconductor layers 420 being the topmost semiconductor layer. It should be understood that the GAA FET device 300 can include any number of first semiconductor layers and any number of second semiconductor layers, with either one of the first or second semiconductor layers being the topmost semiconductor layer, while remaining within the scope of the present disclosure.

The semiconductor layers 410 and 420 may have respective different thicknesses. Further, the first semiconductor layers 410 may have different thicknesses from one layer to another layer. The second semiconductor layers 420 may have different thicknesses from one layer to another layer. The thickness of each of the semiconductor layers 410 and 420 may range from few nanometers to few tens of nanometers. The first layer of the stack may be thicker than other semiconductor layers 410 and 420. In an embodiment, each of the first semiconductor layers 410 has a thickness ranging from about 5 nanometers (nm) to about 20 nm, and each of the second semiconductor layers 420 has a thickness ranging from about 5 nm to about 20 nm.

The two semiconductor layers 410 and 420 have different compositions. In various embodiments, the two semiconductor layers 410 and 420 have compositions that provide for different oxidation rates and/or different etch selectivity between the layers. In an embodiment, the first semiconductor layers 410 include silicon germanium ($Si_{1-x}Ge_x$), and the second semiconductor layers include silicon (Si). In an embodiment, each of the semiconductor layers 420 is silicon that may be undoped or substantially dopant-free (i.e., having an extrinsic dopant concentration from about 0 cm 3 to about $1 \times 10^{17}$ cm$^{-3}$), where for example, no intentional doping is performed when forming the layers 420 (e.g., of silicon).

In various embodiments, the semiconductor layers 420 may be intentionally doped. For example, when the GAA FET device 300 is configured as an n-type transistor (and operates in an enhancement mode), each of the semiconductor layers 420 may be silicon that is doped with a p-type dopant such as boron (B), aluminum (Al), indium (In), and gallium (Ga); and when the GAA FET device 300 is configured as a p-type transistor (and operates in an enhancement mode), each of the semiconductor layers 420 may be silicon that is doped with an n-type dopant such as phosphorus (P), arsenic (As), antimony (Sb). In another example, when the GAA FET device 300 is configured as an n-type transistor (and operates in a depletion mode), each of the semiconductor layers 420 may be silicon that is doped with an n-type dopant instead; and when the GAA FET device 300 is configured as a p-type transistor (and operates in a depletion mode), each of the semiconductor layers 420 may be silicon that is doped with a p-type dopant instead. In some embodiments, each of the semiconductor layers 410 is $Si_{1-x}Ge_x$ that includes less than 50% (x<0.5) Ge in molar ratio. For example, Ge may comprise about 15% to 35% of the semiconductor layers 410 of $Si_{1-x}Ge_x$ in molar ratio. Furthermore, the first semiconductor layers 410 may include different compositions among them, and the second semiconductor layers 420 may include different compositions among them.

Either of the semiconductor layers 410 and 420 may include other materials, for example, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. The materials of the semiconductor layers 410 and 420 may be chosen based on providing differing oxidation rates and/or etch selectivity.

The semiconductor layers 410 and 420 can be epitaxially grown from the semiconductor substrate 302. For example, each of the semiconductor layers 410 and 420 may be grown by a molecular beam epitaxy (MBE) process, a chemical vapor deposition (CVD) process such as a metal organic CVD (MOCVD) process, and/or other suitable epitaxial growth processes. During the epitaxial growth, the crystal structure of the semiconductor substrate 302 extends upwardly, resulting in the semiconductor layers 410 and 420 having the same crystal orientation with the semiconductor substrate 302.

Upon growing the semiconductor layers 410 and 420 on the semiconductor substrate 302 (as a stack), the stack may be patterned to form one or more fin structures (e.g., fin structure 401 shown in FIG. 4). Each of the fin structures is elongated along a lateral direction, and includes a stack of patterned semiconductor layers 410-420 interleaved with each other. The fin structure 401 is formed by patterning the stack of semiconductor layers 410-420 and the semiconductor substrate 302 using, for example, photolithography and etching techniques. Portions of the semiconductor layers 420 may collectively function as a conduction channel of the GAA FET device 300, and the semiconductor layers 410 may be later removed and replaced with a portion of an active gate structure that wraps around each of the semiconductor layers 420. Accordingly, the semiconductor layers 410 and 420 may sometimes be referred to as sacrificial layers 410 and channel layer 420, respectively.

For example, a mask layer (which can include multiple layers such as, for example, a pad oxide layer and an overlying hardmask layer) is formed over the topmost semiconductor layer (e.g., 420 in FIG. 4). The pad oxide layer may be a thin film comprising silicon oxide formed, for example, using a thermal oxidation process. The pad oxide layer may act as an adhesion layer between the topmost semiconductor layer 420 and the hardmask layer. In some embodiments, the hardmask layer may include silicon nitride, silicon oxynitride, silicon carbonitride, the like, or combinations thereof. In some other embodiments, the hardmask layer may include a material similar as a material of the semiconductor layers 410/420 such as, for example, $Si_{1-y}Ge_y$, Si, etc., in which the molar ratio (y) may be different from or similar to the molar ratio (x) of the semiconductor layers 410. The hardmask layer may be formed over the stack (i.e., before patterning the stack) using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer and pad nitride layer to form a patterned mask.

The patterned mask can be subsequently used to pattern exposed portions of the semiconductor layers 410-420 and the substrate 302 to form one or more of the fin structures 410, thereby defining trenches (or openings) between adjacent fin structures. When multiple fin structures are formed, such a trench may be disposed between any adjacent ones of the fin structures. In some embodiments, the fin structure 401 is formed by etching trenches in the semiconductor layers 410-420 and substrate 302 using, for example, reactive ion etch (RIE), neutral beam etch (NBE), the like, or combinations thereof. The etch may be anisotropic. In some embodiments, the trenches may be strips (when viewed from the top) parallel to each other, and closely spaced with respect to each other. In some embodiments, the trenches may be continuous and surround the fin structure 401.

Figure 5:
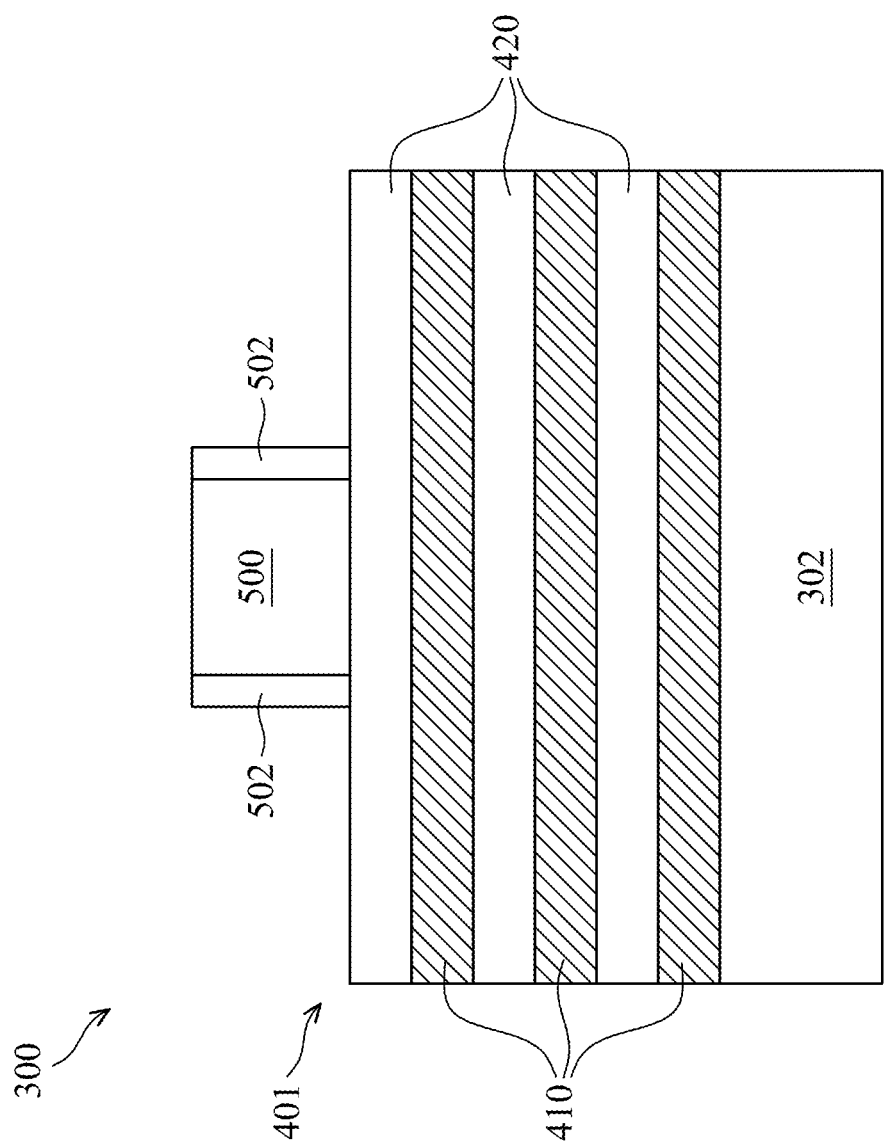

Corresponding to operation 206 of FIG. 2, FIG. 5 is a cross-sectional view of the GAA FET device 300 including a dummy gate structure 500, at one of the various stages of fabrication. The cross-sectional view of FIG. 5 is cut in a direction along the lengthwise direction of a number of channel layers of the GAA FET device 300 (e.g., cross-section A-A indicated in FIG. 1).

The dummy gate structure 500 may have a lengthwise direction perpendicular to the lengthwise direction of the fin structures (e.g., along direction A-A in FIG. 1). As such, the dummy gate structure 500 may be formed to overlay (e.g., straddle) a portion of the fin structure 401. For example, the dummy gate structure 500 may straddle a central portion of the fin structure 401, such that end or side portions of the fin structure 401 are exposed, as shown in FIG. 5.

In some embodiments, the dummy gate structure 500 may contact the top surface of an isolation structure (not shown) embedding a lower portion of the fin structure 401, with its bottom surface. Such an isolation structure, typically referred to as a shallow trench isolation (STI), includes a number of portions, each of which is disposed between neighboring fin structures. In some other embodiments, the neighboring fin structures may be further separated by a cladding layer formed over the STI, which will be removed in a later fabrication stage. In such embodiments, the bottom surface of the dummy gate structure 500 may not contact the top surface of the STI.

The dummy gate structure 500 may include a dummy gate dielectric and a dummy gate, which are not shown separately for purpose of clarity. To form the dummy gate structure 500, a dielectric layer may be formed over the fin structure 410. The dielectric layer may be, for example, silicon oxide, silicon nitride, silicon oxynitride, silicon carbide, silicon carbonitride, silicon oxycarbonitride, silicon oxycarbide, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using suitable lithography and etching techniques. Next, the pattern of the mask layer may be transferred to the gate layer and the dielectric layer by a suitable etching technique to form the dummy gate structure 500.

Upon forming the dummy gate structure 500, a gate spacer 502 may be formed on opposing sidewalls of the dummy gate structure 500, as shown in FIG. 5. The gate spacer 502 may each be a low-k spacer and may be formed of a suitable dielectric material, such as silicon oxide, silicon nitride, silicon carbide, silicon carbonitride, silicon oxynitride, silicon oxycarbonitride, or the like. Any suitable deposition method, such as thermal oxidation, chemical vapor deposition (CVD), or the like, may be used to form the gate spacer 502. The shapes and formation methods of the gate spacer 502, as illustrated in FIG. 5, are merely non-limiting examples, and other shapes and formation methods are possible. These and other variations are fully intended to be included within the scope of the present disclosure.

Figure 6:
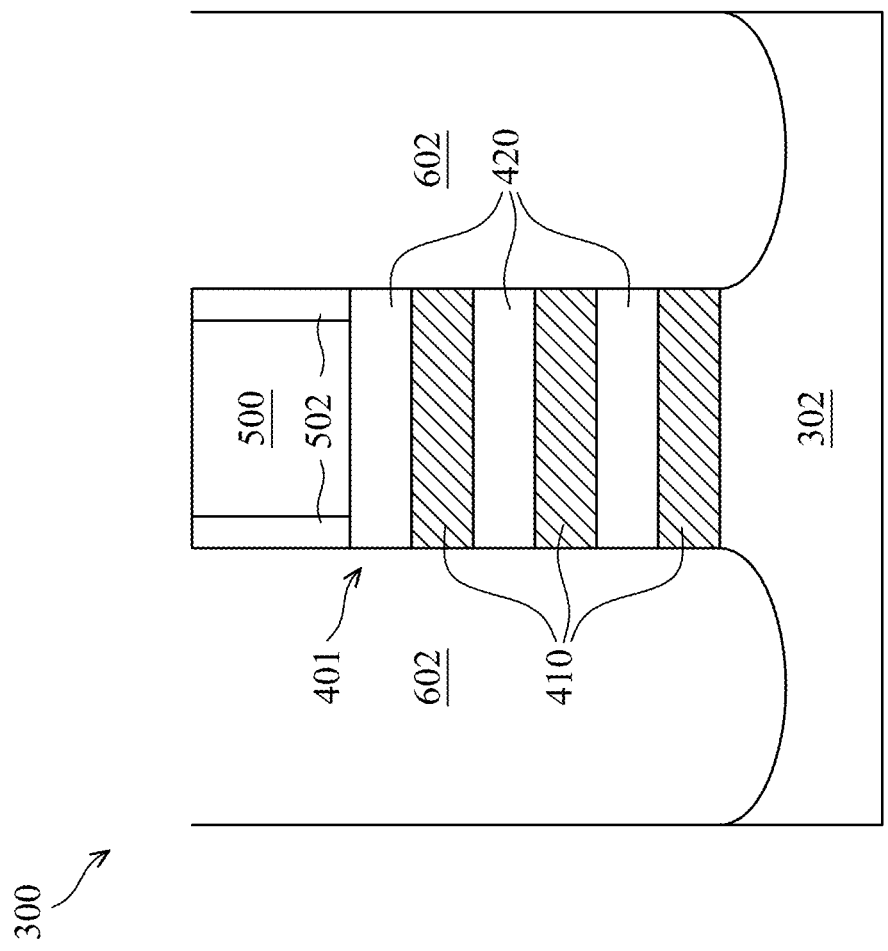

Corresponding to operation 208 of FIG. 2, FIG. 6 is a cross-sectional view of the GAA FET device 300 in which (e.g., end) portions of the fin structure 401 that are not overlaid by the dummy gate structure 500 (together with the gate spacer 502) are recessed, at one of the various stages of fabrication. The cross-sectional view of FIG. 6 is cut in a direction along the lengthwise direction of a number of channel layers of the GAA FET device 300 (e.g., cross-section A-A indicated in FIG. 1).

As shown, the dummy gate structure 500 (together with the gate spacer 502) can serve as a mask to recess (e.g., etch) the non-overlaid portions of the fin structure 401, which results in the remaining fin structure 401 having respective remaining portions of the semiconductor layers 410 and 420 alternately stacked on top of one another. As a result, recesses 602 can be formed on opposite sides of the remaining fin structure 410. A source/drain structure can be formed in each of the recesses 602 in a later fabrication stage. Accordingly, the recess 602 is sometimes referred to as a source/drain (S/D) recess. The recesses 602 can expose respective sidewalls of the remaining semiconductor layers 410 and 420. In some embodiments, such newly exposed sidewalls of the semiconductor layers 410 and 410 may vertically align with a sidewall of the gate spacer 502. Alternatively stated, a single contact face, consisting of the sidewalls of the semiconductor layers 410 and 410, can be formed on each side of the dummy gate structure 500.

The recessing step to form the recesses 602 may be configured to have at least some anisotropic etching characteristic. For example, the recessing step can include a plasma etching process, which can have a certain amount of anisotropic characteristic. In such a plasma etching process (including radical plasma etching, remote plasma etching, and other suitable plasma etching processes), gas sources such as chlorine ($Cl_2$), hydrogen bromide (HBr), carbon tetrafluoride ($CF_4$), fluoroform ($CHF_3$), difluoromethane ($CH_2F_2$), fluoromethane ($CH_3F$), hexafluoro-1,3-butadiene ($C_4F_6$), boron trichloride ($BCl_3$), sulfur hexafluoride ($SF_6$), hydrogen ($H_2$), nitrogen trifluoride ($NF_3$), and other suitable gas sources and combinations thereof can be used with passivation gases such as nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof. Moreover, for the recessing step, the gas sources and/or the passivation gases can be diluted with gases such as argon (Ar), helium (He), neon (Ne), and other suitable dilutive gases and combinations thereof.

Figure 7A:
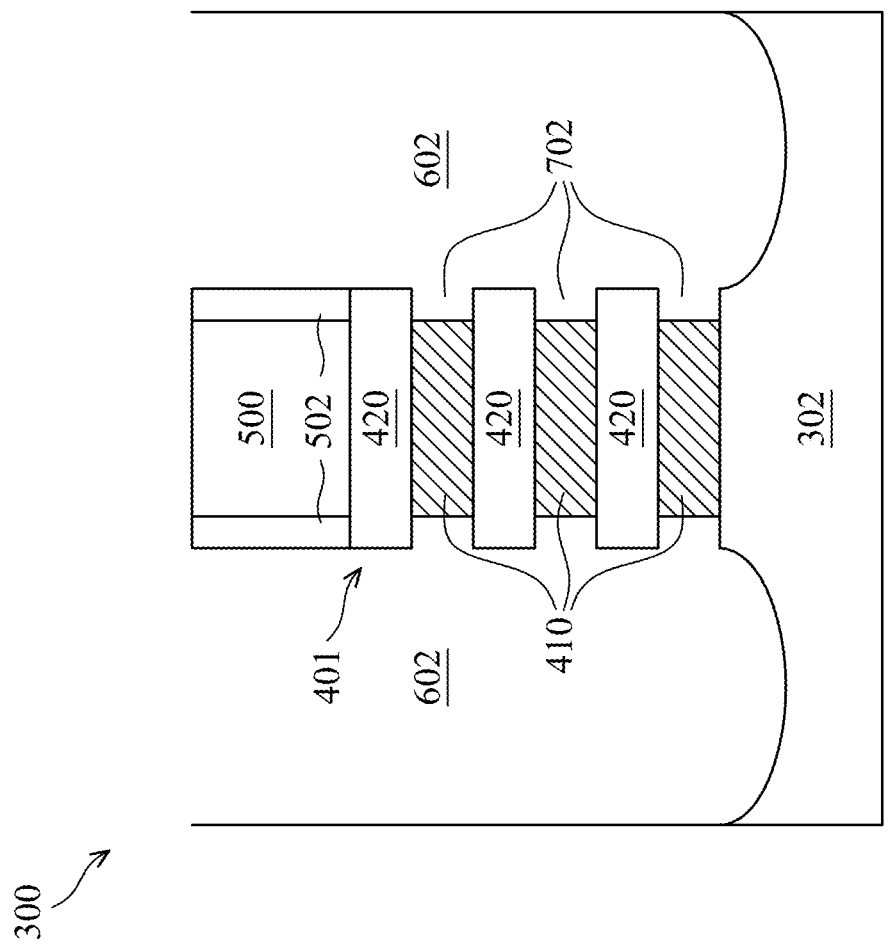
Figure 7B:
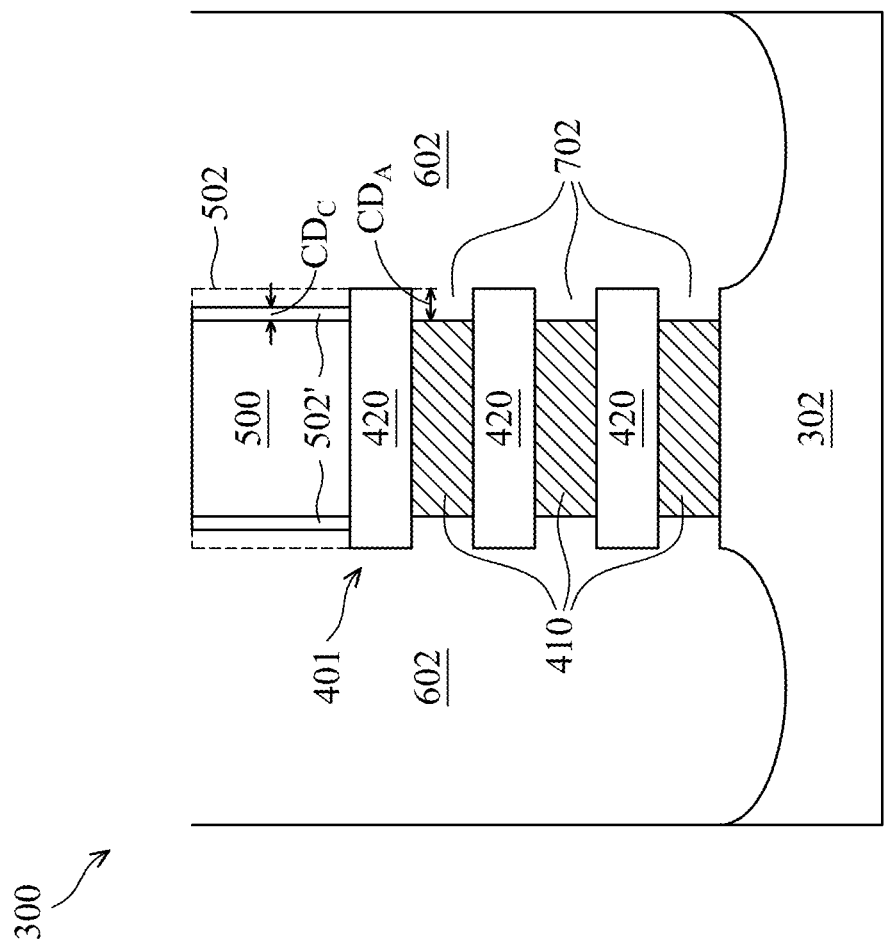
Figure 7C:
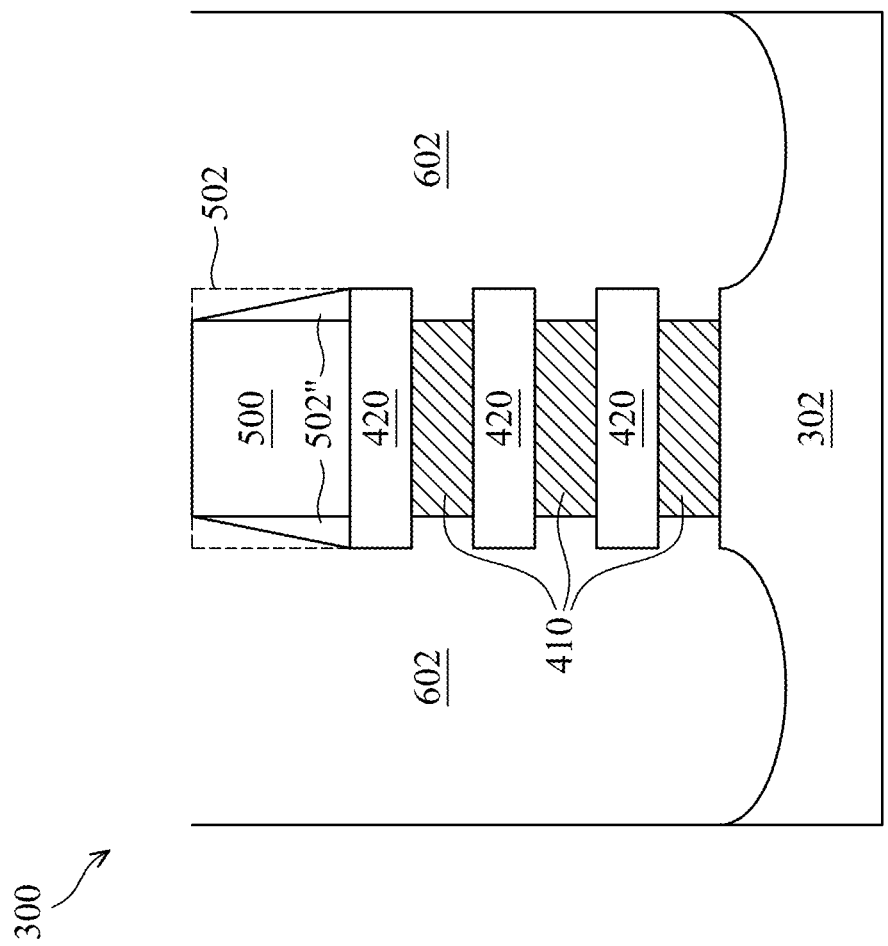

Corresponding to operation 210 of FIG. 2, FIG. 7A is a cross-sectional view of the GAA FET device 300 in which respective end portions of the semiconductor layers 410 are recessed, at one of the various stages of fabrication. In FIGS. 7B and 7C, illustrated are cross-sectional views of other embodiments of the GAA FET device 300 in which the respective end portions of the semiconductor layers 401 are recessed. The cross-sectional views of FIGS. 7A-C are each cut in a direction along the lengthwise direction of a number of channel layers of the GAA FET device 300 (e.g., cross-section A-A indicated in FIG. 1).

The end portions of the semiconductor layers 410 can be removed (e.g., etched) using a "pull-back" process to pull the semiconductor layers 410 back by a pull-back distance. In an example where the semiconductor layers 420 include Si, and the semiconductor layers 410 include SiGe, the pull-back process may include a hydrogen chloride (HCl) gas isotropic etch process, which etches SiGe without attacking Si. As such, the Si layers (nanostructures) 420 may remain substantially intact during this process. Consequently, a pair of recesses, 702, can be formed on the ends of each semiconductor layer 410, with respect to the neighboring semiconductor layers 420. Alternatively or additionally, while etching the semiconductor layers 410, portions of the semiconductor layers 420 may also be etched back by a pull-back distance, which is generally controlled to be close to zero by selecting an etchant that has a high etching selectivity between the materials of the semiconductor layers 410 and 420. According to various embodiments, while etching the semiconductor layers 410, profiles of the gate spacer 502 may remain or change accordingly, which will be respectively discussed in FIGS. 7A-C.

Referring first to FIG. 7A, the gate spacer 502 may remain substantially intact during the pull-back process of the semiconductor layers 410. In such embodiments, the etchant used in the pull-back process can have a high etching selectivity between the materials of the gate spacer 502 and the semiconductor layers 410. For example, the etchant (e.g., $Cl_2$, HBr, $CF_4$. $CHF_3$. $CH_2F_2$, or $CH_3F$) may etch the semiconductor layers 410 at a substantially higher rate than etch the gate spacer 502. As such, a top surface of the topmost semiconductor layer of the fin structure 401 (e.g., 420) may remain covered by the dummy gate structure 500 and the gate spacer 502.

Referring next to FIG. 7B, the gate spacer 502 may be pulled back concurrently with the pull-back process of the semiconductor layers 410, thereby forming a gate spacer 502'. In such embodiments, the etchant used in the pull-back process can have a low etching selectivity between the materials of the gate spacer 502 and the semiconductor layers 410. For example, the etchant (e.g., $Cl_2$, HBr, $CF_4$. $CHF_3$. $CH_2F_2$, or $CH_3F$) may etch the semiconductor layers 410 at a slightly higher rate than etch the gate spacer 502. The gate spacer 502/502' is pulled back by a distance ($CD_C$), which is controlled to be slightly less than the pull-back distance ($CD_A$) of the semiconductor layers 410. Further, the etchant may laterally etch side portions of the gate spacer 502 uniformly along its sidewall. As such, the gate spacer 502' can have an essentially vertical sidewall. By forming the gate spacer 502', a portion of the top surface of the topmost semiconductor layer of the fin structure 401 (e.g., 420) may be exposed.

Referring then to FIG. 7C, the gate spacer 502 may be pulled back concurrently with the pull-back process of the semiconductor layers 410, thereby forming a gate spacer 502". In such embodiments, the etchant used in the pull-back process can have a low etching selectivity between the materials of the gate spacer 502 and the semiconductor layers 410. For example, the etchant (e.g., $Cl_2$, HBr, $CF_4$. $CHF_3$. $CH_2F_2$, or $CH_3F$) may etch the semiconductor layers 410 at a slightly higher rate than etch the gate spacer 502. Further, the etchant may laterally etch side portions of the gate spacer 502 non-uniformly along its sidewall. For example, an upper portion of the gate spacer 502 may be etched more than a lower portion of the gate spacer 502. As such, the gate spacer 502" can have a tilted sidewall. In particular, the gate spacer 502" can have a reducing thickness, with an increasing height of the gate spacer 502". By forming the gate spacer 502", a portion of the top surface of the topmost semiconductor layer of the fin structure 401 (e.g., 420) may or may not be exposed.

Figure 7D:
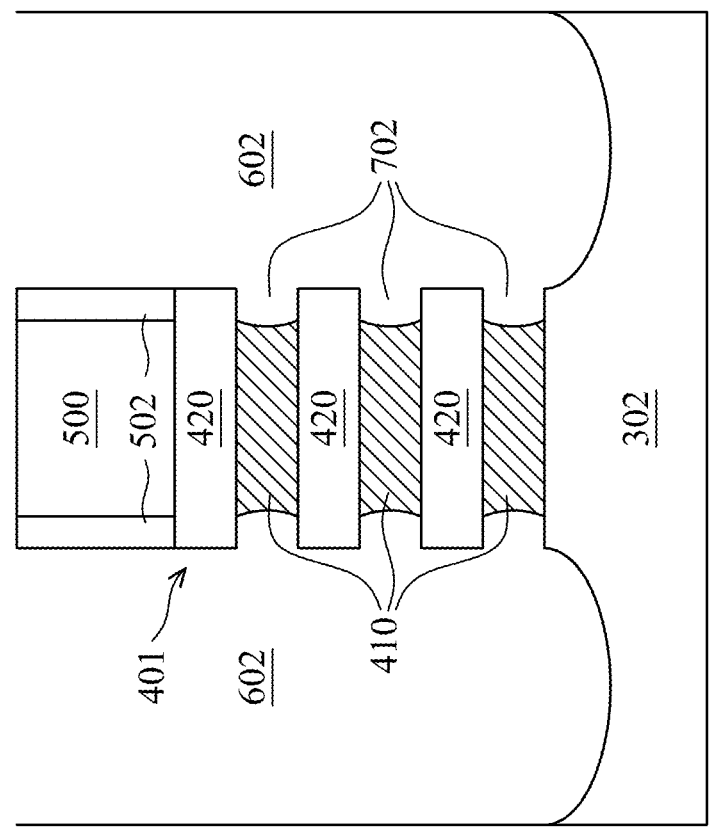

In some other embodiments, the recess 702 can be formed with a curvature-based sidewall, as shown in cross-sectional view of FIG. 7D. The cross-sectional view of FIG. 7D is cut in a direction along the lengthwise direction of a number of channel layers of the GAA FET device 300 (e.g., cross-section A-A indicated in FIG. 1). The curvature-based sidewall may inwardly protrude toward the semiconductor layer 410. Such a curvature-based sidewall may be achieved by increasing an isotropic etching characteristic of the pull-back process, such that the semiconductor layers 410 may be etched non-uniformly along its sidewall. Although in the illustrated embodiment of FIG. 7D, the gate spacer 502 (e.g., that remains substantially intact) is shown, it should be understood that the above-illustrated gate spacer 502' and 502" can be formed concurrently with the recess 702 that has a curvature-based sidewall, while remaining within the scope of the present disclosure.

Figure 8A:
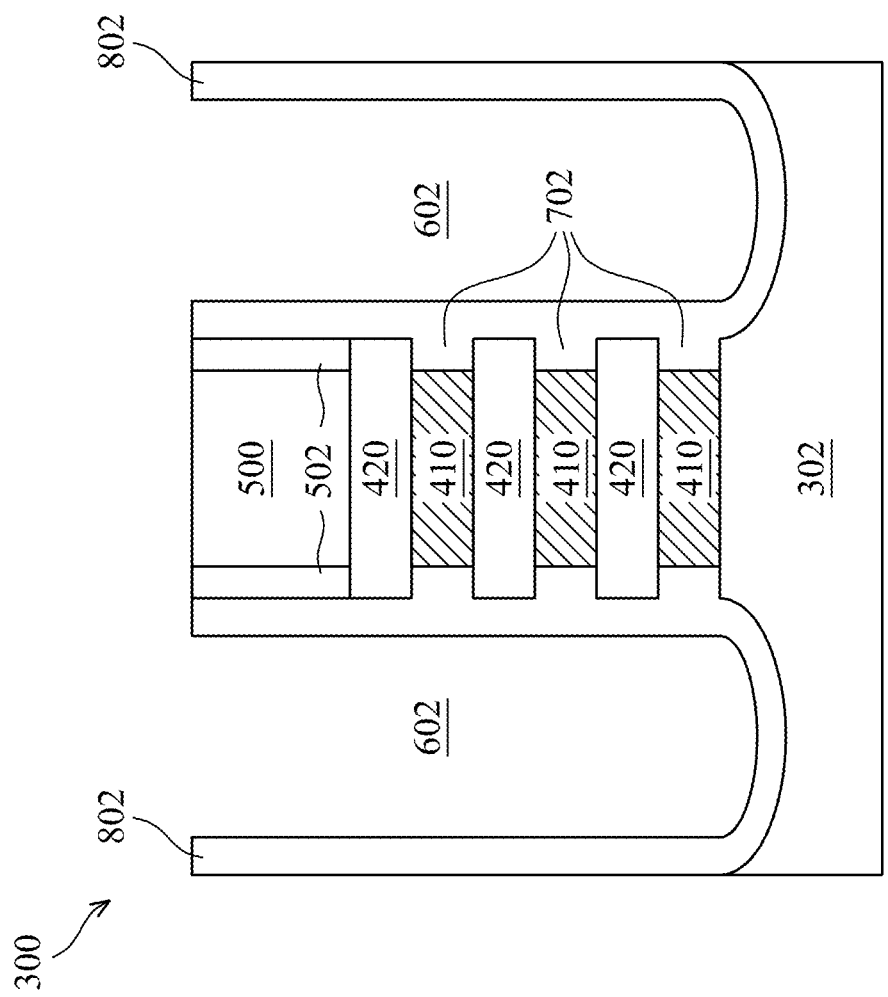
Figure 8B:
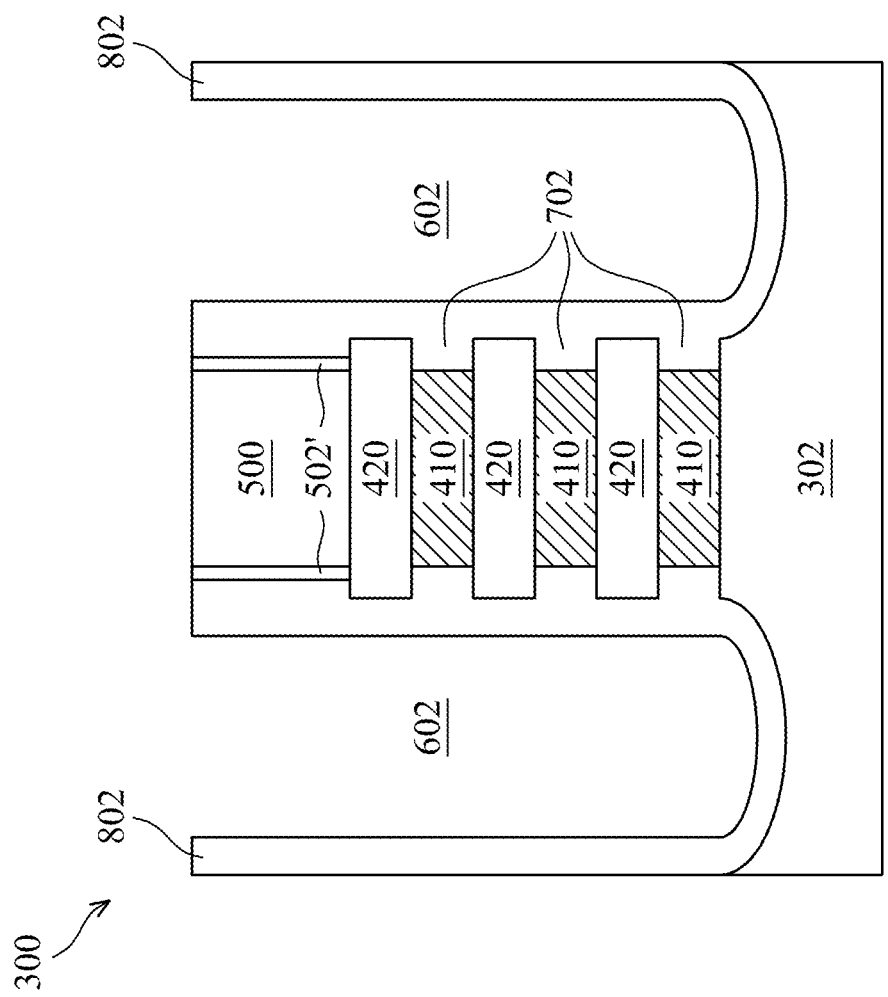
Figure 8C:
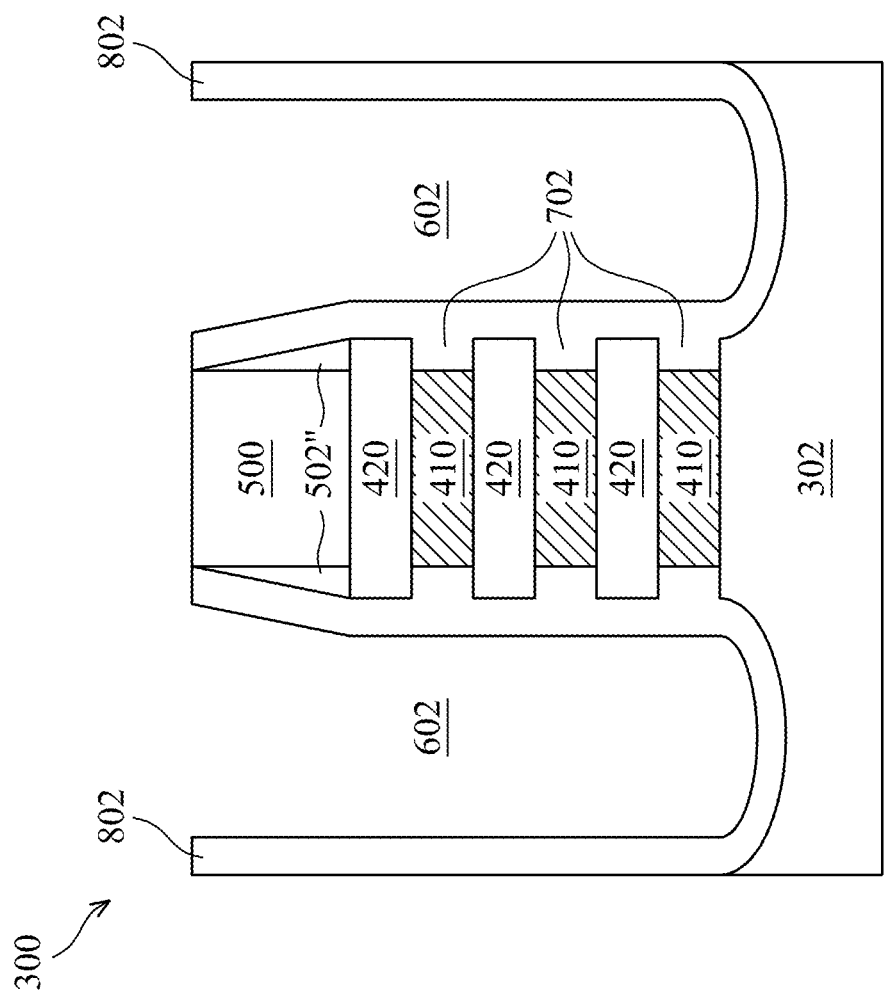
Figure 8D:
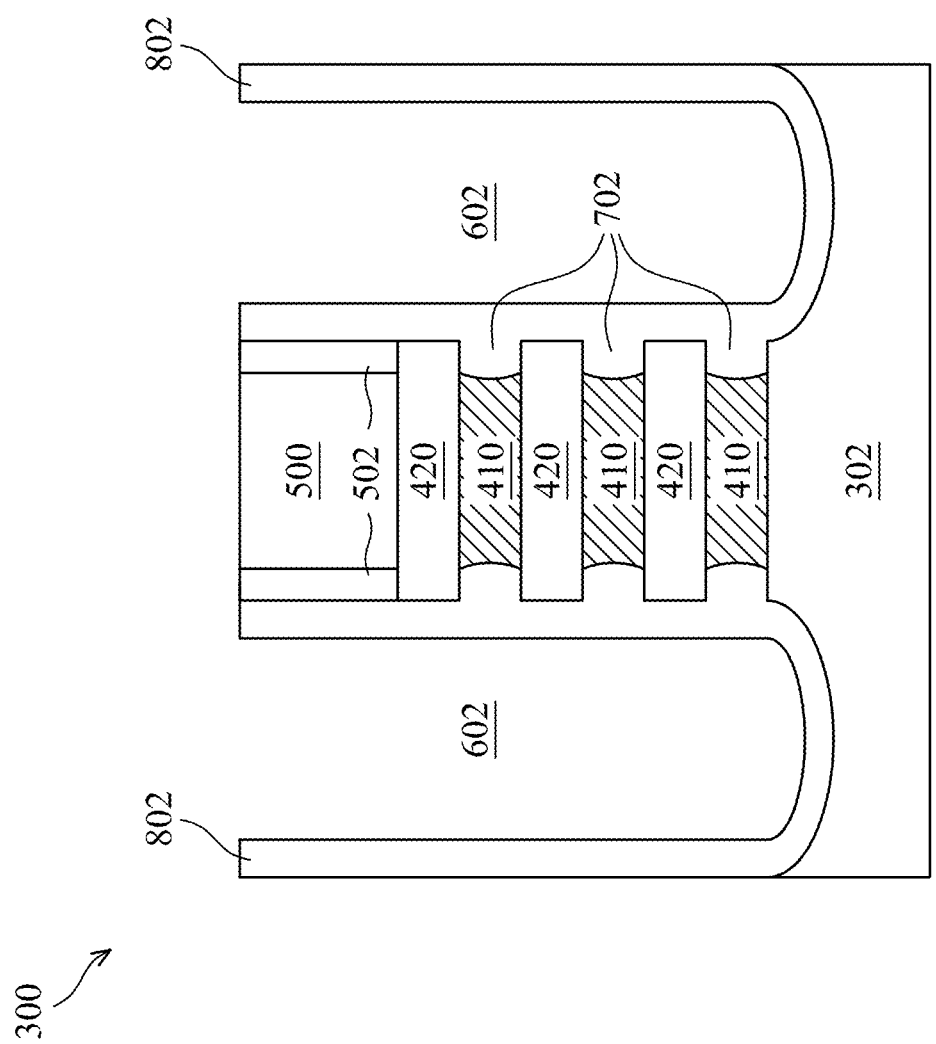

Corresponding to operation 212 of FIG. 2, FIG. 8A is a cross-sectional view of the GAA FET device 300 including a dielectric layer 802 formed over the workpiece shown in FIG. 7A, at one of the various stages of fabrication. In FIGS. 8B, 8C, and 8D, illustrated are cross-sectional views of other embodiments of the GAA FET device 300 including the dielectric layer 802 formed over the workpiece shown in FIGS. 7B, 7C, and 7D, respectively. The cross-sectional views of FIGS. 8A-D are each cut in a direction along the lengthwise direction of a number of channel layers of the GAA FET device 300 (e.g., cross-section A-A indicated in FIG. 1).

As shown (e.g., in any of FIGS. 8A-D), the dielectric layer 802 is formed to line the S/D recesses 602, with a controlled thickness. As such, the dielectric layer 802 can fill up the recesses 702, while leaving a portion of each S/D recess 602 vacant. Therefore, the dielectric layer 802 can inherit the dimensions and profiles of a number of contact faces that are collectively formed by the sidewall of each semiconductor layer 420, the top surface of each semiconductor layer 420 (except for the example in FIG. 8A), the bottom surface of each semiconductor layer 420, and the etched sidewall of each semiconductor layer 410. The dielectric layer 802 may be a low-k spacer and may be formed of a suitable dielectric material, such as silicon oxide, silicon nitride, silicon carbide, silicon carbonitride, silicon oxynitride, silicon oxycarbonitride, or the like. Any suitable deposition method, such as thermal oxidation, chemical vapor deposition (CVD), or the like, may be used to form the dielectric layer 802.

In some embodiments, the respective materials or material compositions of the gate spacer 502/502'/502" and the dielectric layer 802 may be different. As such, an etching selectivity may exist between the gate spacer and the dielectric layer in a later pull-back process to form inner spacers along the (etched) ends of each semiconductor layer 410. For example, the pull-back process can etch the dielectric layer 802 in an etching rate faster than etch the gate spacer 502/502'/502". In a non-limiting example where the dielectric layer 802 and the gate spacer 502/502'502" both include silicon oxycarbonitride, a carbon concentration of the gate spacer may be higher than a carbon concentration of the dielectric layer, which can cause the gate spacer to be etched slower. In another non-limiting example where the dielectric layer 802 and the gate spacer 502/502'502" include silicon nitride and silicon oxycarbonitride, respectively, which can also cause the gate spacer to be etched slower.

Figure 9A:
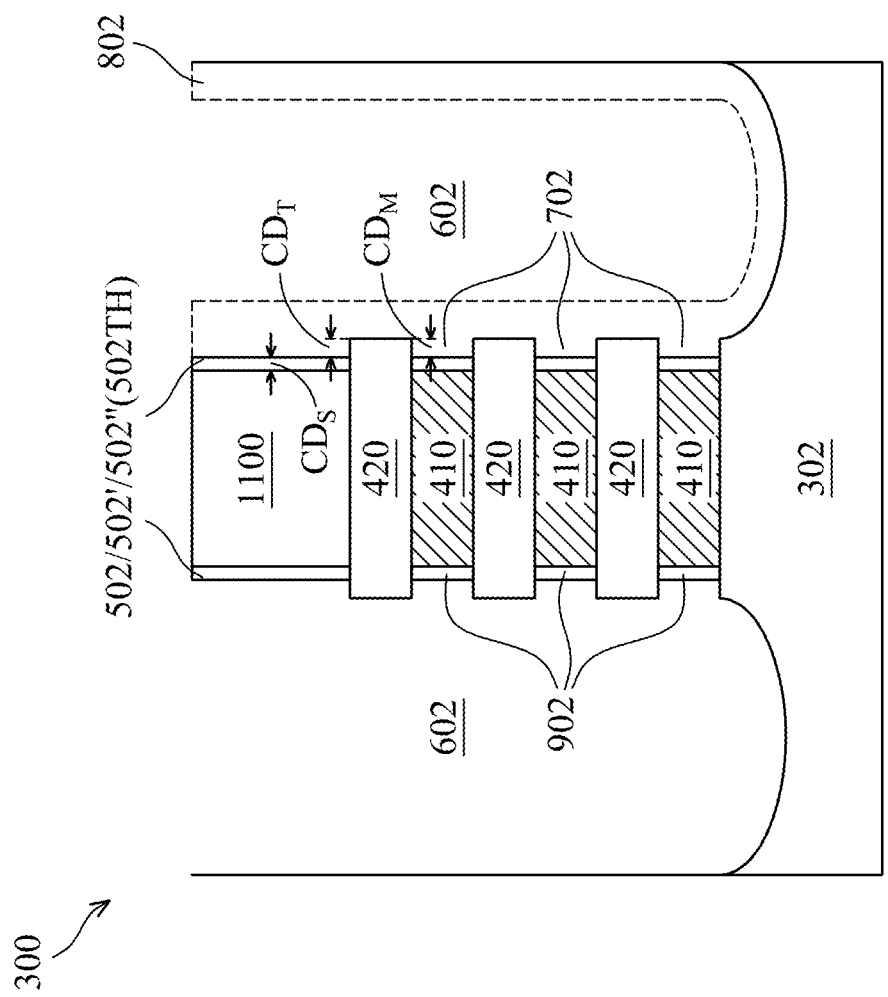
Figure 9B:
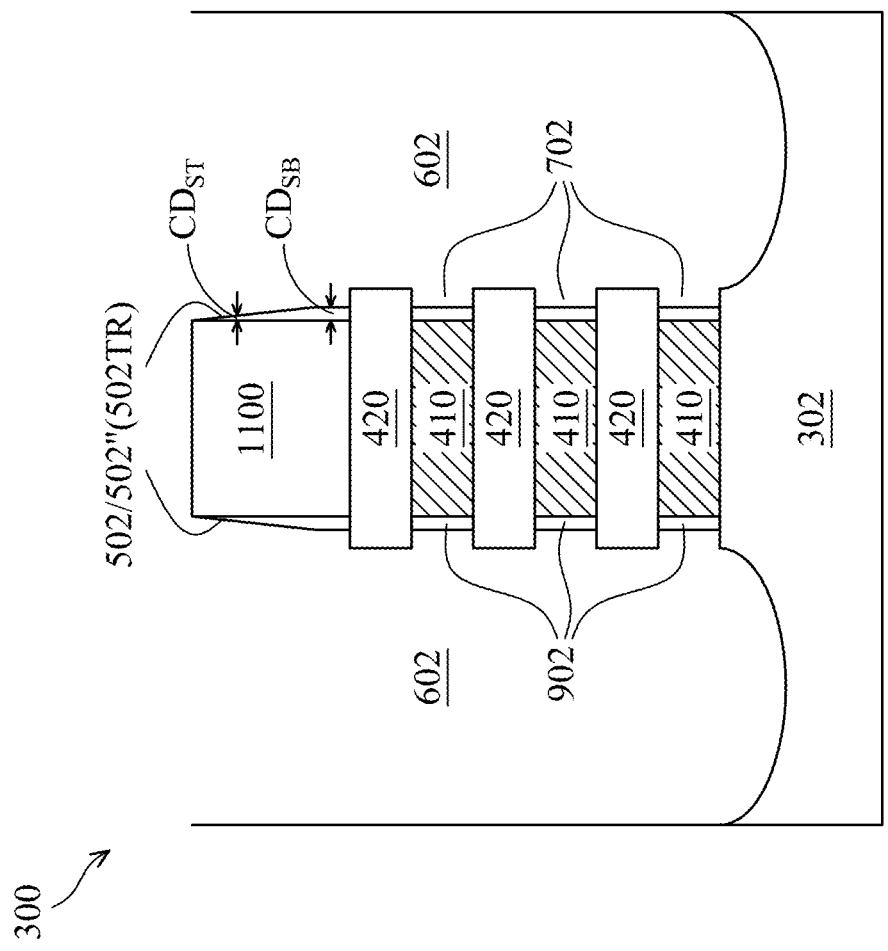
Figure 9C:
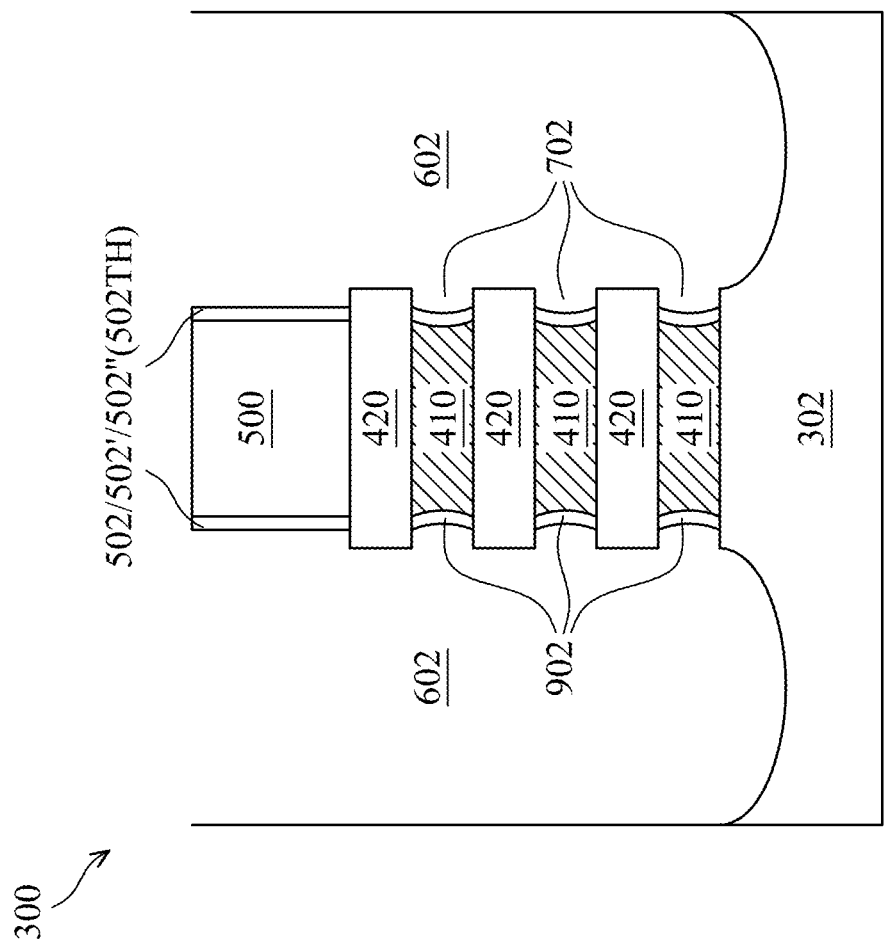

Corresponding to operation 214 of FIG. 2, FIG. 9A is a cross-sectional view of the GAA FET device 300 including a number of inner spacers 902, at one of the various stages of fabrication. In FIGS. 9B and 9C, illustrated are cross-sectional views of other embodiments of the GAA FET device 300 including the inner spacers 902. The cross-sectional views of FIGS. 9A-C are each cut in a direction along the lengthwise direction of a number of channel layers of the GAA FET device 300 (e.g., cross-section A-A indicated in FIG. 1).

In accordance with various embodiments of the present disclosure, the inner spacers 902 are each formed within the recess 702, with a portion of the top surface of the next lower semiconductor layer 420 and a portion of the bottom surface of the next upper semiconductor layer 420 exposed. The inner spacer 902 can be formed by performing at least one isotropic and/or anisotropic pull-back process to remove various portions of the dielectric layer 802. In particular, a portion of the dielectric layer 802 laterally next to the sidewall of each of the semiconductor layers 410, a portion of the dielectric layer 802 laterally next to the sidewall of each of the semiconductor layers 420, a portion of the dielectric layer 802 laterally next to the sidewall of the gate spacer 502/502'/502", and a portion of the dielectric layer 802 on a surface of the semiconductor substrate 302 (over a bottom surface of the S/D recess 602) can be concurrently removed by the pull-back process.

With concurrently pulling back the gate spacer 502/502'/502", the gate spacer 502 (which remains substantially intact when forming the recesses 702, as discussed with respect to FIG. 7A) may be etched thinner or tapered, as illustrated in FIGS. 9A and 9B, respectively. Specifically in FIG. 9A, upon the gate spacer 502 being etched thinner (but still substantially vertical), a portion of the top surface of the topmost semiconductor layer 410, which was covered by the gate spacer 502, can also be exposed. Specifically in FIG. 9B, upon the gate spacer 502 being etched tapered (e.g., a thickness of the gate spacer 502 gradually decreases with increasing height of the gate spacer), a portion of the top surface of the topmost semiconductor layer 410, which was covered by the gate spacer 502, can also be exposed. Regarding the gate spacer 502' (which has been recessed thinner, as discussed with respect to FIG. 7B), it may be etched further thinner, as shown in FIG. 9A. A further portion of the top surface of the topmost semiconductor layer 410 can thus be exposed. Regarding the gate spacer 502" (which has been recessed tapered, as discussed with respect to FIG. 7C), it may be etched thinner (FIG. 9A) or tapered (FIG. 9B). A portion or a further portion of the top surface of the topmost semiconductor layer 410 can thus be exposed.

In various embodiments, a thickness of the thinned down gate spacer 502/502'/502" (hereinafter "gate spacer 502TH") may be characterized with a critical dimension, $CD_S$ (as illustrated in FIG. 9A); and thicknesses of an upper portion and a lower portion of the tapered gate spacer 502/502'/502" (hereinafter "gate spacer 502TR") may be characterized with critical dimensions, $CD_{ST}$ and $CD_{SB}$, respectively (as illustrated in FIG. 9B). In a non-limiting example, the critical dimension $CD_S$ of the gate spacer 502TH may range from about 2 nm to about 50 nm; and the critical dimensions $CD_{ST}$ and $CD_{SB}$ of the gate spacer 502TR may each range from about 2 nm to about 50 nm, wherein $CD_{ST}$ is less than $CD_{SB}$.

In various embodiments, the inner spacer 902 may follow the profile of the recess 702, which can present a substantially vertical sidewall or a curvature-based sidewall, as illustrated in FIGS. 9A-B and 9C, respectively. Regardless of the profile, the sidewall of the inner spacer 902 can inwardly shift with respect to the sidewall of the semiconductor layer 420. In the example of FIGS. 9A-B, the vertical sidewall of the inner spacer 902 is laterally spaced from the sidewall of the semiconductor layer 420 with a constant distance. In the example of FIG. 9C, the curved sidewall of the inner spacer 902 is laterally spaced from the sidewall of the semiconductor layer 420 with a varying distance.

By forming the inner spacer 902 that inwardly shifts with respect to the sidewall of the semiconductor layer 420, each of the semiconductor layers 420 can protrude from the neighboring gate/inner spacers, thereby forming a number of faces in the S/D recess 602. Such plural faces in the S/D recess 602 are collectively formed by the sidewall of each semiconductor layer 420, the top surface of each semiconductor layer 420, the bottom surface of each semiconductor layer 420, the newly formed sidewall of each inner spacer 902, and the newly formed sidewall of the gate spacer 502/502'/502". The distances with which the semiconductor layer 420 protrudes from the gate spacer 502/502'/502" and the inner spacer 902 can be characterized by $CD_T$ and $CD_M$, respectively. In various embodiments, $CD_T$ is equal to, less than, or greater than $CD_M$. In a non-limiting example, the critical dimensions $CD_T$ and $CD_M$ may each range from about 0.3 nm to about 20 nm.

Figure 10A:
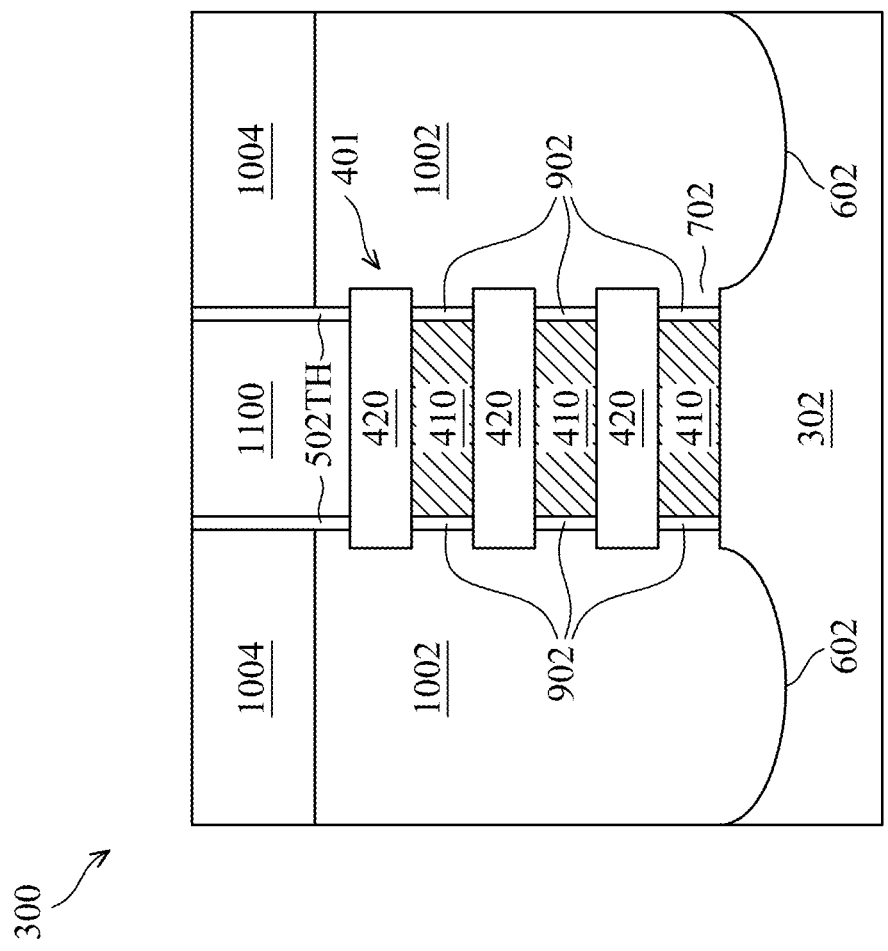
Figure 10B:
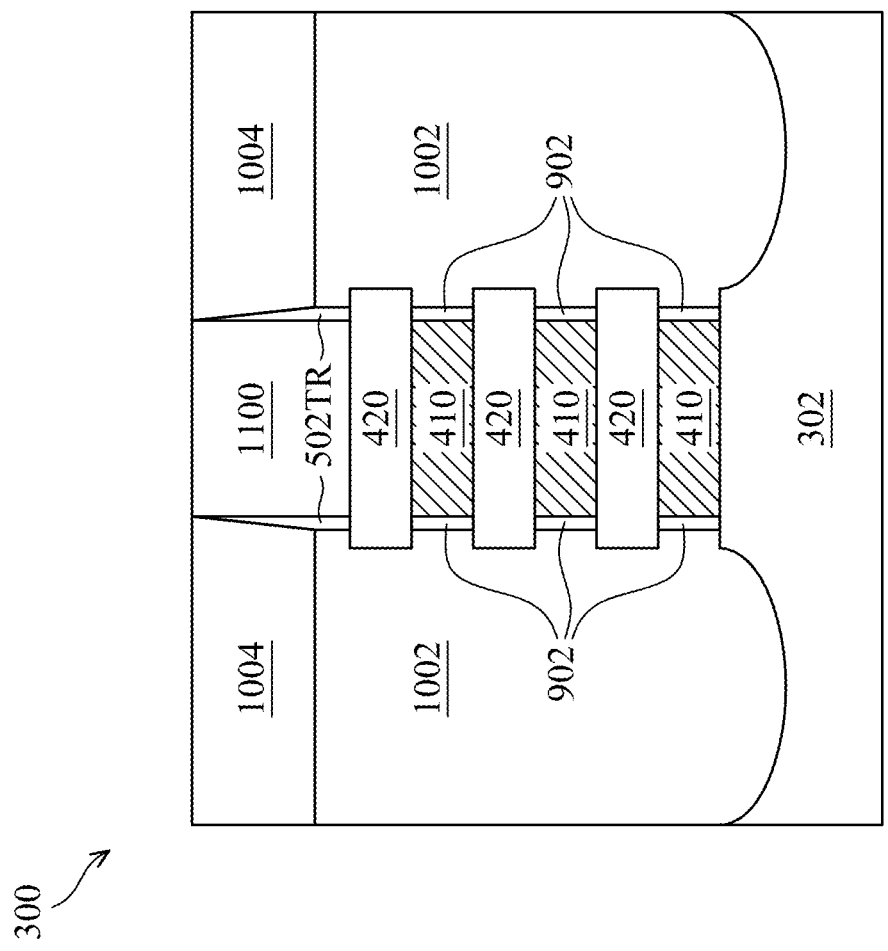
Figure 10C:
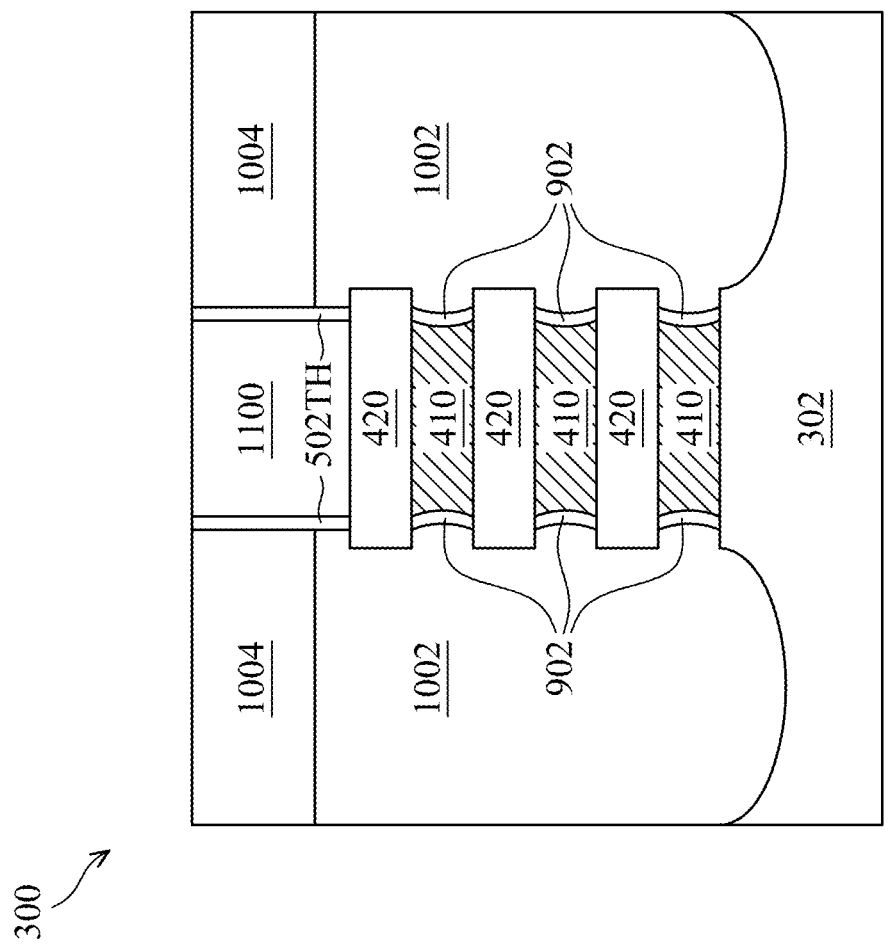

Corresponding to operation 216 of FIG. 2, FIG. 10A is a cross-sectional view of the GAA FET device 300 including source/drain structures 1002 formed over the workpiece shown in FIG. 9A, at one of the various stages of fabrication. In FIGS. 10B and 10C, illustrated are cross-sectional views of other embodiments of the GAA FET device 300 including the source/drain structures 1002 formed over the workpiece shown in FIGS. 9B and 9C, respectively. The cross-sectional views of FIGS. 10A-C are each cut in a direction along the lengthwise direction of a number of channel layers of the GAA FET device 300 (e.g., cross-section A-A indicated in FIG. 1).

The source/drain structure 1002 is disposed in the S/D recess 602 and further (e.g., laterally) extends into the recess 702. As shown in any of FIGS. 10A-C, the source/drain structures 1002 are disposed on the opposite sides of the fin structure 401 to couple to the semiconductor (channel) layers 420, and separate from the semiconductor (sacrificial) layers 410 with the inner spacer 902 disposed therebetween. According to various embodiments, with the inner spacer 902 inwardly shifts with respect to the sidewall of the channel layer 420, the source/drain structure 1002 can (e.g., electrically) contact the channel layers 420, with multiple faces. For example, the source/drain structure 1002 can contact the channel layers 420, with the sidewalls, the end portions of the top surface, and the end portions of the bottom surface of each of the channel layers 420. Further, the source/drain structures 1002 are separated from the dummy gate structure 500, with (at least a lower portion of) the gate spacer 502TH or 502TR. The source/drain structures 1002 are formed by epitaxially growing a semiconductor material in the recesses 602 using suitable methods such as metal-organic CVD (MOCVD), molecular beam epitaxy (MBE), liquid phase epitaxy (LPE), vapor phase epitaxy (VPE), selective epitaxial growth (SEG), the like, or combinations thereof Upon forming the source/drain structures 1002, an interlayer dielectric (ILD) 1004 is formed over the source/drain structure 1002. The ILD 1004 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD is formed, an optional dielectric layer (not shown) is formed over the ILD. The dielectric layer can function as a protection layer to prevent or reduces the loss of the ILD in subsequent etching processes. The dielectric layer may be formed of a suitable material, such as silicon nitride, silicon carbonitride, or the like, using a suitable method such as CVD, PECVD, or FCVD. After the dielectric layer is formed, a planarization process, such as a CMP process, may be performed to achieve a level top surface for the dielectric layer. After the planarization process, the top surface of the dielectric layer is level with the top surface of the dummy gate structure 500, in some embodiments.

Figure 11A:
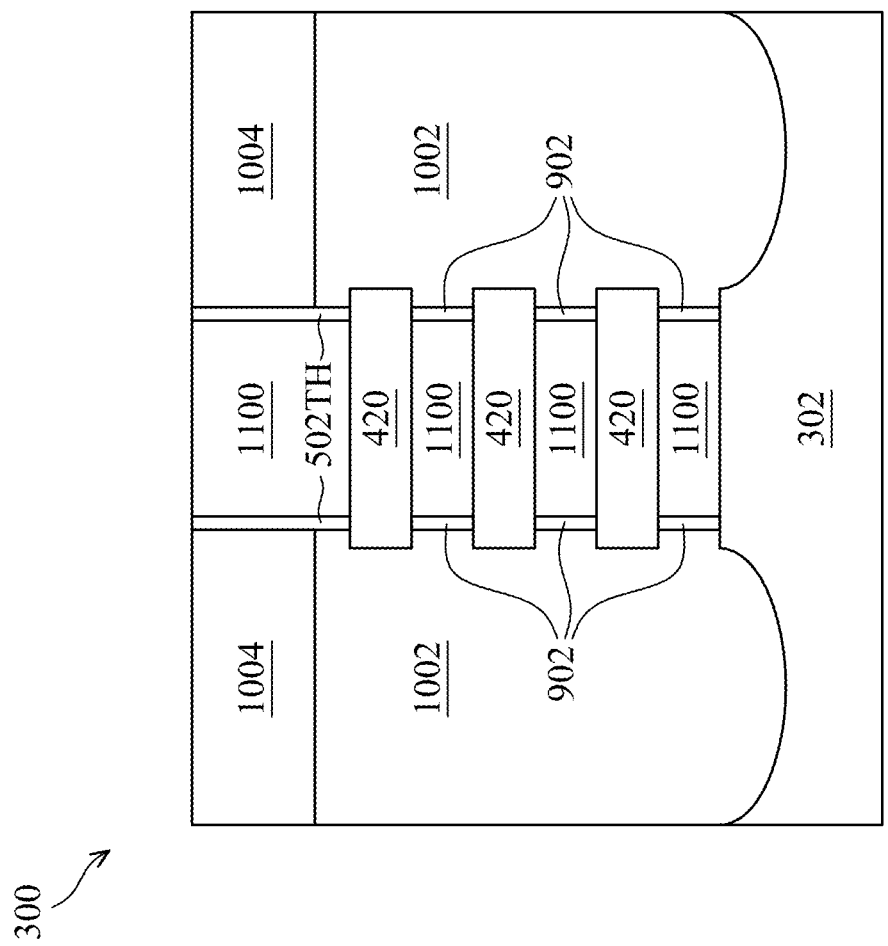
Figure 11B:
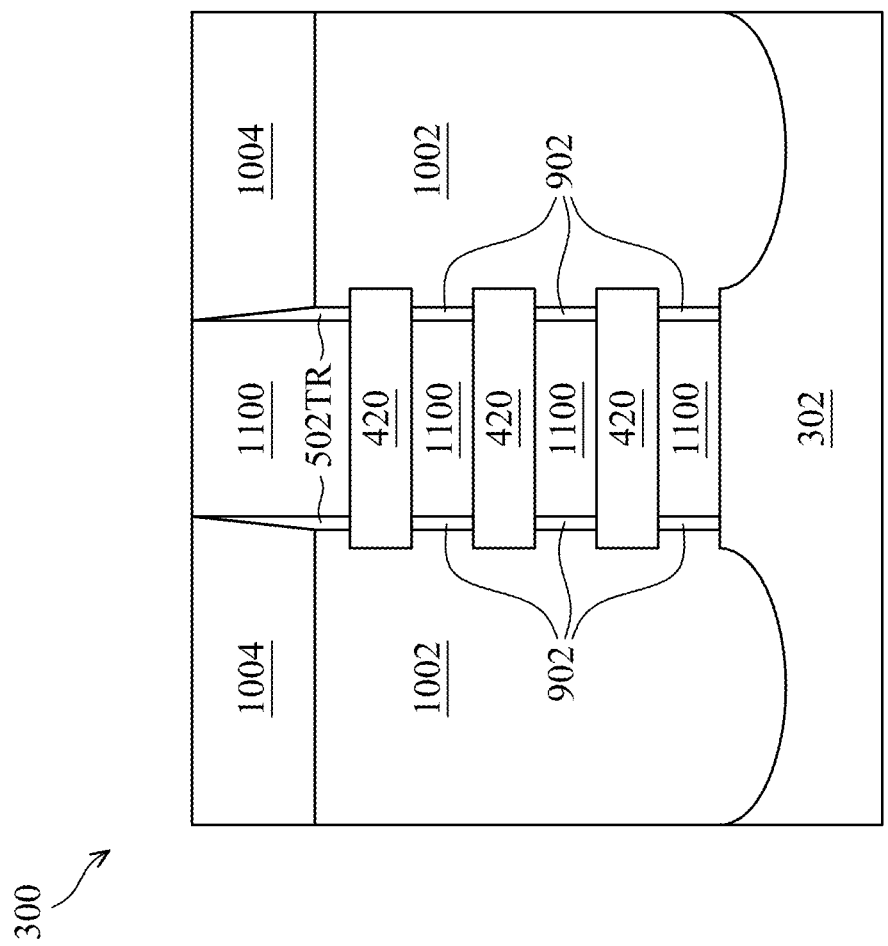
Figure 11C:
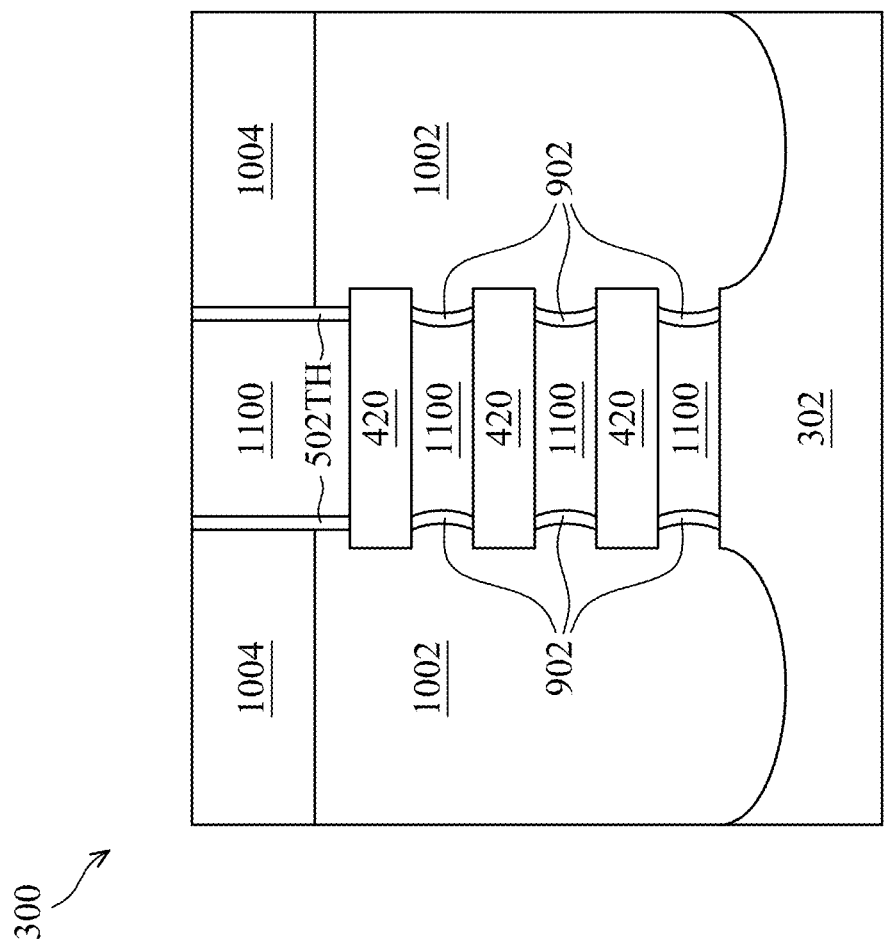

Corresponding to operation 218 of FIG. 2, FIG. 11A is a cross-sectional view of the GAA FET device 300 including an active (e.g., metal) gate structure 1100 formed over the workpiece shown in FIG. 10A, at one of the various stages of fabrication. In FIGS. 11B and 11C, illustrated are cross-sectional views of other embodiments of the GAA FET device 300 including the active gate structure 1100 formed over the workpiece shown in FIGS. 10B and 10C, respectively. The cross-sectional views of FIGS. 11A-C are each cut in a direction along the lengthwise direction of a number of channel layers of the GAA FET device 300 (e.g., cross-section A-A indicated in FIG. 1).

Subsequently to forming the ILD 1004, the dummy gate structure 500 and the (remaining) sacrificial layers 410 may be concurrently removed. In various embodiments, the dummy gate structure 500 and the sacrificial layers 410 can be removed by applying a selective etch, while leaving the channel layers 420 substantially intact. After the removal of the dummy gate structure 500, a gate trench, exposing respective sidewalls of each of the channel layers 420 may be formed. After the removal of the sacrificial layers 410 to further extend the gate trench, respective bottom surface and/or top surface of each of the channel layers 420 may be exposed. Consequently, a full circumference of each of the channel layers 420 can be exposed. Next, the active gate structure 1100 is formed to wrap around each of the channel layers 420.

The active gate structures 1100 can include a gate dielectric and a gate metal, in some embodiments. The gate dielectric can wrap around each of the channel layers 420, e.g., the top and bottom surfaces and sidewalls). The gate dielectric may be formed of different high-k dielectric materials or a similar high-k dielectric material. Example high-k dielectric materials include a metal oxide or a silicate of Hf, Al, Zr, La, Mg, Ba, Ti, Pb, and combinations thereof. The gate dielectric may include a stack of multiple high-k dielectric materials. The gate dielectric can be deposited using any suitable method, including, for example, molecular beam deposition (MBD), atomic layer deposition (ALD), PECVD, and the like. In some embodiments, the gate dielectric may optionally include a substantially thin oxide (e.g., $SiO_x$) layer, which may be a native oxide layer formed on the surface of each of the channel layers 420.

The gate metal may include a stack of multiple metal materials. For example, the gate metal may be a p-type work function layer, an n-type work function layer, multi-layers thereof, or combinations thereof. The work function layer may also be referred to as a work function metal. Example p-type work function metals that may include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage $V_t$ is achieved in the device that is to be formed. The work function layer(s) may be deposited by CVD, physical vapor deposition (PVD), ALD, and/or other suitable process.

In one aspect of the present disclosure, a semiconductor device is disclosed. The semiconductor device includes a plurality of channel layers vertically spaced from one another. The semiconductor device includes a gate structure wrapping around each of the plurality of channel layers. The semiconductor device includes an epitaxial structure electrically coupled to the plurality of channel layers. The epitaxial structure contacts a sidewall, a portion of a top surface, and a portion of a bottom surface of each of the plurality of channel layers.

In another aspect of the present disclosure, a semiconductor device is disclosed. The semiconductor device includes a substrate. The semiconductor device includes a plurality of channel layers that are disposed above the substrate and extend along a first direction. The semiconductor device includes a metal gate structure that extends along a second direction perpendicular to the first direction and wraps around each of the plurality of channel layers. The semiconductor device includes a gate spacer disposed along an upper portion of the metal gate structure. The semiconductor device includes an inner spacer disposed along a lower portion of the metal gate structure. The semiconductor device includes a source/drain structure disposed along the metal gate structure, with the gate spacer and the inner spacer disposed therebetween. Each of the plurality of channel layers extends toward the source/drain structure beyond a sidewall of the gate spacer and a sidewall of the inner spacer that contact the source/drain structure.

In yet another aspect of the present disclosure, a method for making a semiconductor device is disclosed. The method includes forming a fin structure over a substrate, wherein the fin structure comprises a plurality of channel layers and a plurality of sacrificial layers alternately stacked on top of one another. The method includes forming a dummy gate structure straddling the fin structure. The method includes removing an upper portion of the fin structure that laterally protrudes from the dummy gate structure. The method includes removing respective end portions of the plurality of sacrificial layers. The method includes forming an inner spacer comprising a plurality of portions, each of which extends along a sidewall of each of the plurality of sacrificial layers, wherein the plurality of channel layers laterally protrude from an exposed sidewall of the inner spacer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a silicon substrate comprising a recess;
   a plurality of channel layers vertically spaced from one another;
   a gate structure including an upper portion disposed over a lower portion, the lower portion wrapping around each of the plurality of channel layers;
   an inner spacer disposed along sidewalls of the lower portion of the gate structure, wherein the inner spacer curves toward the lower portion of the gate structure and laterally overlaps the upper portion of the gate structure; and
   an epitaxial structure in direct contact with a sidewall, a portion of a top surface, and a portion of a bottom surface of each of the plurality of channel layers, wherein the epitaxial structure is a single epitaxial layer and a bottom portion of the epitaxial structure has a curved shape that is in direct contact with the silicon substrate in the recess of the silicon substrate.

2. The semiconductor device of claim 1, wherein the inner spacer includes a plurality of portions each disposed between neighboring ones of the plurality of channel layers.

3. The semiconductor device of claim 1, wherein the epitaxial structure is electrically coupled to the plurality of channel layers, and wherein a sidewall of the epitaxial structure curves with the inner spacer toward the lower portion of the gate structure.

4. The semiconductor device of claim 3, wherein the sidewall of the epitaxial structure contacting the plurality of channel layers presents a square-wave profile.

5. The semiconductor device of claim 3, wherein the gate structure is electrically isolated from the epitaxial structure through the inner spacer.

6. The semiconductor device of claim 1, further comprising a gate spacer that is disposed along a sidewall of the upper portion of the gate structure.

7. The semiconductor device of claim 6, wherein each of the channel layers laterally protrudes from the gate spacer.

8. The semiconductor device of claim 6, wherein a thickness of the gate spacer decreases with an increasing height of the gate spacer.

9. The semiconductor device of claim 1, wherein the plurality of channel layers extend along a first direction and the gate structures extends along a second direction perpendicular to the first direction, and wherein the epitaxial structure is disposed on a side of the channel layers along the first direction.

10. The semiconductor device of claim 1, further comprising a gate spacer disposed along the upper portion of the gate structure, and wherein a sidewall of the gate spacer is tilted toward a sidewall of the upper portion of the gate structure as a height of the gate structure increases.

11. A semiconductor device, comprising:
a silicon substrate comprising a recess;
a plurality of channel layers vertically spaced from one another;
a gate structure including an upper portion disposed over a lower portion, the lower portion wrapping around each of the plurality of channel layers;
an inner spacer disposed along sidewalls of the lower portion of the gate structure, wherein the inner spacer curves toward the lower portion of the gate structure, and wherein a portion of the inner spacer is laterally disposed between sidewalls of the upper portion of the gate structure; and
a source/drain structure in direct contact with a sidewall, a portion of a top surface, and a portion of a bottom surface of each of the plurality of channel layers, wherein the drain/source structure is a single epitaxial layer and a bottom portion of the source/drain structure has a curved shape that is in direct contact with the silicon substrate in the recess of the silicon substrate.

12. The semiconductor device of claim 11, further comprising a gate spacer disposed along the upper portion of the gate structure.

13. The semiconductor device of claim 12, wherein a sidewall of the gate spacer is tilted toward a sidewall of the upper portion of the gate structure as a height of the gate structure increases.

14. The semiconductor device of claim 13, wherein the sidewall of the gate spacer is perpendicular to a top surface of the channel layers.

15. The semiconductor device of claim 12, wherein the source/drain structure is disposed along the gate structure, with the gate spacer and the inner spacer disposed therebetween.

16. The semiconductor device of claim 15, wherein each of the plurality of channel layers extends toward the source/drain structure beyond a sidewall of the gate spacer and a sidewall of the inner spacer that each contact the source/drain structure.

17. The semiconductor device of claim 16, wherein the sidewall of the inner spacer has a curvature-based profile.

18. A semiconductor device, comprising:
a silicon substrate comprising a recess;
a plurality of channel layers disposed above a substrate and extending along a first direction;
a metal gate structure extending along a second direction perpendicular to the first direction, the metal gate structure including an upper portion disposed over a lower portion, the lower portion wrapping around each of the plurality of channel layers;
a gate spacer disposed along the upper portion of the metal gate structure;
an inner spacer disposed along the lower portion of the metal gate structure, wherein the inner spacer curves toward the metal gate structure and laterally overlaps the upper portion of the metal gate structure; and
a source/drain structure in direct contact with a sidewall, a portion of a top surface, and a portion of a bottom surface of each of the plurality of channel layers, wherein the epitaxial structure is a single epitaxial layer and a bottom portion of the source/drain structure has a curved shape that is in direct contact with the silicon substrate in the recess of the silicon substrate.

19. The semiconductor device of claim 18, wherein the source/drain structure is disposed along the metal gate structure, with the gate spacer and the inner spacer disposed therebetween, and wherein a sidewall of the source/drain structure curves with the inner spacer toward the metal gate structure.

20. The semiconductor device of claim 19, wherein each of the plurality of channel layers extends toward the source/drain structure beyond a sidewall of the gate spacer and a sidewall of the inner spacer that contact the source/drain structure.

* * * * *